United States Patent
Morita et al.

(10) Patent No.: US 8,299,737 B2
(45) Date of Patent: Oct. 30, 2012

(54) MOTOR DRIVING CIRCUIT

(75) Inventors: Tatsuo Morita, Kyoto (JP); Yasuhiro Uemoto, Shiga (JP); Tsuyoshi Tanaka, Osaka (JP); Matsuo Shiraishi, Aichi (JP); Atsushi Morimoto, Aichi (JP); Kouichi Ishikawa, Aichi (JP)

(73) Assignee: Panasonic Corporation, Osaka (JP)

( * ) Notice: Subject to any disclaimer, the term of this patent is extended or adjusted under 35 U.S.C. 154(b) by 599 days.

(21) Appl. No.: 12/596,770

(22) PCT Filed: Dec. 2, 2008

(86) PCT No.: PCT/JP2008/003566
§ 371 (c)(1),
(2), (4) Date: Oct. 20, 2009

(87) PCT Pub. No.: WO2009/072272
PCT Pub. Date: Jun. 11, 2009

(65) Prior Publication Data
US 2010/0127652 A1 May 27, 2010

(30) Foreign Application Priority Data
Dec. 7, 2007 (JP) .................................. 2007-317112

(51) Int. Cl.
*H02P 6/14* (2006.01)
(52) U.S. Cl. .............. 318/400.27; 318/400.23; 257/192; 257/195
(58) Field of Classification Search ............... 318/400.1, 318/400.13, 400.23, 400.27; 257/192, 195
See application file for complete search history.

(56) References Cited

U.S. PATENT DOCUMENTS

| | | | | |
|---|---|---|---|---|
| 6,580,101 B2* | 6/2003 | Yoshida | ................... | 257/192 |
| 7,038,252 B2* | 5/2006 | Saito et al. | .................. | 257/192 |
| 7,298,123 B2* | 11/2007 | Watanabe et al. | ............ | 323/282 |
| 7,595,680 B2* | 9/2009 | Morita et al. | ................. | 327/427 |
| 7,825,435 B2* | 11/2010 | Machida et al. | ............. | 257/195 |
| 7,838,907 B2* | 11/2010 | Shiraishi | ..................... | 257/195 |
| 7,852,137 B2* | 12/2010 | Machida et al. | ............. | 327/427 |
| 7,868,353 B2* | 1/2011 | Machida et al. | ............. | 257/133 |
| 7,875,907 B2* | 1/2011 | Honea et al. | ................. | 257/192 |
| 8,076,699 B2* | 12/2011 | Chen et al. | ................... | 257/194 |
| 8,159,848 B2* | 4/2012 | Morimoto et al. | ........... | 363/127 |
| 2003/0052544 A1 | 3/2003 | Yamamoto et al. | | |

(Continued)

FOREIGN PATENT DOCUMENTS
JP 05-236797 9/1993
(Continued)

*Primary Examiner* — Paul Ip
(74) *Attorney, Agent, or Firm* — McDermott Will & Emery LLP

(57) ABSTRACT

A motor driving circuit includes a three-phase inverter circuit 8, including three upper-arm switching elements 56a to 56c for driving upper arms of different phases of a three-phase motor 3, and three lower-arm switching elements 56d to 56f for driving lower arms of different phases. At least one of the upper-arm switching elements 56a to 56c and the lower-arm switching elements 56d to 56f is a semiconductor element that performs a diode operation. The diode operation is an operation in which a voltage less than or equal to a threshold voltage of a gate electrode G is applied to the gate electrode G with reference to a potential of a first ohmic electrode S, thereby conducting a current flow from the first ohmic electrode S to a second ohmic electrode D and blocking a current flow from the second ohmic electrode D to the first ohmic electrode S.

14 Claims, 14 Drawing Sheets

U.S. PATENT DOCUMENTS

| | | |
|---|---|---|
| 2006/0060871 A1 | 3/2006 | Beach |
| 2006/0113971 A1* | 6/2006 | Watanabe et al. ............. 323/265 |
| 2006/0267541 A1 | 11/2006 | Battello et al. |
| 2006/0273347 A1* | 12/2006 | Hikita et al. ................... 257/192 |
| 2007/0057259 A1* | 3/2007 | Nagumo ......................... 257/67 |
| 2008/0191216 A1* | 8/2008 | Machida et al. ................ 257/76 |
| 2008/0211567 A1* | 9/2008 | Morita et al. .................. 327/425 |
| 2008/0315257 A1* | 12/2008 | Shiraishi ....................... 257/195 |
| 2009/0065810 A1* | 3/2009 | Honea et al. .................. 257/192 |
| 2009/0121775 A1* | 5/2009 | Ueda et al. .................... 327/427 |
| 2009/0167411 A1* | 7/2009 | Machida et al. .............. 327/427 |
| 2009/0206363 A1* | 8/2009 | Machida et al. .............. 257/133 |
| 2010/0127652 A1* | 5/2010 | Morita et al. ............ 318/400.27 |
| 2010/0135053 A1* | 6/2010 | Morimoto et al. ............ 363/127 |
| 2011/0018002 A1* | 1/2011 | Chen et al. ....................... 257/76 |
| 2011/0215746 A1* | 9/2011 | Ikoshi et al. .............. 318/400.27 |
| 2012/0099357 A1* | 4/2012 | Morita .......................... 363/131 |

FOREIGN PATENT DOCUMENTS

| | | |
|---|---|---|
| JP | 07-222459 | 8/1995 |
| JP | 11-261053 | 9/1999 |
| JP | 2003-086814 | 3/2003 |
| JP | 2004-273486 | 9/2004 |
| JP | 2005-006478 | 1/2005 |
| JP | 2009212183 A * | 9/2009 |

* cited by examiner (a)

(b)

(c)

(a)

(b)

(c)

(a)

(b)

(a)

(b)

(a)

(b)

MOTOR DRIVING CIRCUIT

RELATED APPLICATIONS

This application is the U.S. National Phase under 35 U.S.C. §371 of International Application No. PCT/JP2008/003566, filed on Dec. 2, 2008, which in turn claims the benefit of Japanese Application No. 2007-317112, filed on Dec. 7, 2007, the disclosures of which applications are incorporated by reference herein.

TECHNICAL FIELD

The present invention relates to a motor driving circuit for controlling a three-phase motor by an inverter control.

BACKGROUND ART

When a three-phase brushless DC motor is controlled by an inverter control, upper-arm switching elements and lower-arm switching elements of a three-phase inverter circuit are switched around so as to convert a DC power to a three-phase AC power.

Methods known as inverter conduction control methods include a 120-degree conduction method in which the ON period of each switching element is set to an electrical angle of $2\pi/3$, and a 180-degree conduction method in which the ON period of each switching element is set to an electrical angle of $\pi$. In order to control the torque of the three-phase brushless DC motor, the switching elements of the three-phase inverter circuit are controlled by a pulse width modulation (PWM) control.

With the aforementioned three-phase brushless DC motor control method, when an upper-arm switching element (or a lower-arm switching element) of a predetermined phase is blocked for a PWM control, a magnetic energy that has accumulated in the inductance of the three-phase brushless DC motor is urged to continuously flow during the OFF period, due to the large inductance of the three-phase brushless DC motor.

In order to address this issue, a recirculation diode (flywheel diode) is connected in a reverse parallel position with respect to each switching element to demagnetize the magnetic energy, which has accumulated in the inductance, through the flywheel diode.

In a PWM control, a high voltage in the reverse direction is applied immediately after a current in the forward direction passes through a flywheel diode. At this point, the flywheel diode instantaneously passes a current flowing in the reverse direction, called a "recovery current". A recovery current is a power that is unnecessary for driving a motor, and is consumed as heat by an inverter circuit, thereby being a cause for a decrease in the power conversion efficiency of the inverter.

Where a Metal-Oxide-Semiconductor (MOS) transistor is used as a switching element, the parasitic diode of the MOS transistor is used as the flywheel diode. However, the parasitic diode of a MOS transistor has a long recovery period, during which a recovery current flows. Therefore, due to the recovery current, there is a substantial power loss, and heating is likely to occur.

Where an IGBT (insulated gate bipolar transistor) is used as a switching element, since it has no parasitic diode, it is necessary to provide an external flywheel diode. By using a fast recovery diode (FRD) with less recovery current as an external flywheel diode, it is possible to reduce the switching loss (see, for example, Patent Document 1).

Patent Document 1: Japanese Published Patent Application No. H07-222459

DISCLOSURE OF THE INVENTION

Problems to be Solved by the Invention

However, with a current inverter circuit, it is necessary to provide an external FRD, thereby increasing the number of components of the inverter circuit, thus preventing a reduction in the size and a reduction in the cost.

The present disclosure solves the above problems, and implements an inverter without providing an external diode, thus realizing a motor driving circuit having a simpler configuration.

Means for Solving the Problems

The present disclosure is directed to a motor driving circuit including a switching element, which is a semiconductor element that has no parasitic diode and is capable of a diode operation.

Specifically, an example motor driving circuit is a motor driving circuit for driving a three-phase motor, including: a three-phase inverter circuit, including three upper-arm switching elements for driving upper arms of different phases of the three-phase motor, and three lower-arm switching elements for driving lower arms of different phases, at least one of the lower-arm switching elements and the upper-arm switching elements is a semiconductor element, including a semiconductor layer stack made of nitride semiconductor layers formed on a substrate, a first ohmic electrode and a second ohmic electrode formed on the semiconductor layer stack spaced apart from each other, and a first gate electrode formed between the first ohmic electrode and the second ohmic electrode, wherein the semiconductor element performs a diode operation in which a voltage less than or equal to a threshold voltage of the first gate electrode is applied to the first gate electrode with reference to a potential of the first ohmic electrode, thereby conducting a current flow from the first ohmic electrode to the second ohmic electrode and blocking a current flow from the second ohmic electrode to the first ohmic electrode.

In the example motor driving circuit, at least one of the switching elements is a semiconductor element that performs a diode operation in which the voltage less than or equal to threshold voltage of the first gate electrode is applied to the first gate electrode with reference to the potential of the first ohmic electrode, thereby conducting a current flow from the first ohmic electrode to the second ohmic electrode and blocking a current flow from the second ohmic electrode to the first ohmic electrode. Therefore, it is possible to prevent a short-circuit between the upper and lower arms without connecting a flywheel diode to the inverter element. In such a case, the recovery current is very small, and it is possible to reduce the switching loss occurring due to the recovery current of the flywheel diode. The semiconductor element includes a semiconductor layer stack made of nitride semiconductor layers formed on a substrate, a first ohmic electrode and a second ohmic electrode formed on the semiconductor layer stack spaced apart from each other, and a first gate electrode formed between the first ohmic electrode and the second ohmic electrode, whereby there occurs no parasitic diode. Thus, it is possible to reduce the large recovery loss which occurs due to a parasitic diode.

Effects of the Invention

With the disclosed motor driving circuit, it is possible to implement an inverter without providing an external diode and to realize a motor driving circuit having a simpler configuration.

DESCRIPTION OF REFERENCE NUMERALS

Figure 1:
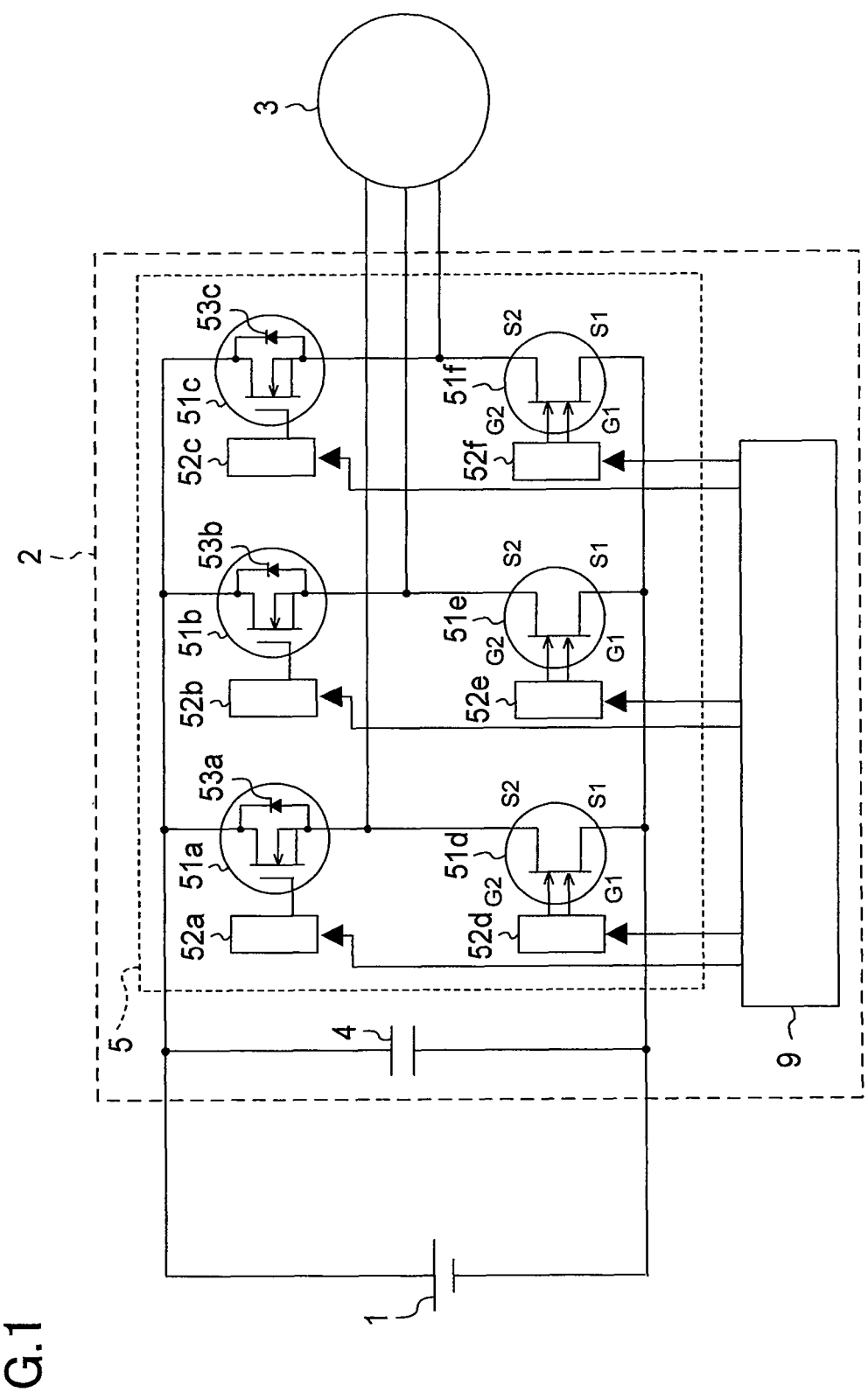
FIG. 1 A circuit diagram showing a motor driving circuit according to a first embodiment of the present invention.

1 DC power source
2 Motor driving circuit
3 Three-phase brushless DC motor
4 Smoothing capacitor
5 Three-phase inverter circuit
7 Three-phase inverter circuit
8 Three-phase inverter circuit
9 Gate controller
10 Semiconductor element
10A First transistor
10B Second transistor
11 Substrate
12 Buffer layer
13 Semiconductor layer stack
14 First semiconductor layer
15 Second semiconductor layer
16A First ohmic electrode
16B Second ohmic electrode
17 Passivation film
18A First gate electrode
18B Second gate electrode
19A First control layer
19B Second control layer
20 Control section
21 First power supply
22 Second power supply
23 Gate driving circuit
24 Control signal source
30 Semiconductor element
31 Substrate
32 Buffer layer
33 Semiconductor layer stack
34 First semiconductor layer
35 Second semiconductor layer
36A First ohmic electrode
36B Second ohmic electrode
37 Passivation film
38 Gate electrode
39 Control layer
51a Switching element
51b Switching element
51c Switching element
51d Switching element
51e Switching element
51f Switching element
52a Gate circuit
52b Gate circuit
52c Gate circuit
52d Gate circuit
52e Gate circuit
52f Gate circuit
53a Diode
53b Diode
53c Diode
54a Switching element
54b Switching element
54c Switching element
54d Switching element
54e Switching element
54f Switching element
55a Gate circuit
55b Gate circuit
55c Gate circuit
55d Gate circuit
55e Gate circuit
55f Gate circuit
56a Switching element
56b Switching element
56c Switching element
56d Switching element
56e Switching element 56f Switching element
57a Gate circuit
57b Gate circuit
57c Gate circuit
57d Gate circuit
57e Gate circuit
57f Gate circuit
61 First ohmic electrode wire
62 Second ohmic electrode wire
63 Gate electrode wire
65 Active region
66 Inactive region
67 First ohmic electrode pad
68 Second ohmic electrode pad
69 Gate electrode pad

DETAILED DESCRIPTION OF PREFERRED EMBODIMENTS

First Embodiment

A first embodiment of the present invention will now be described with reference to the drawings.

(1) Configuration of Inverter Circuit

A DC motor driving circuit of the present embodiment will be described with reference to the drawings. FIG. 1 shows a circuit configuration of a three-phase brushless DC motor driving circuit. As shown in FIG. 1, a motor driving circuit 2 of the first embodiment receives a DC power supplied from a DC power source 1 to drive a three-phase brushless DC motor, which is a permanent magnet synchronous motor.

The motor driving circuit 2 includes a smoothing capacitor 4, a three-phase inverter circuit 5, and a gate controller 9.

A three-phase brushless DC motor 3 includes a U-phase coil, a V-phase coil and a W-phase coil connected together in a start connection (or a delta connection), and the rotor is equipped with a predetermined number of pairs of field magnets.

The three-phase inverter circuit 5 is a DC-AC conversion circuit for converting the DC voltage applied from the DC power source 1 to a three-phase AC voltage, and outputting the three-phase AC voltage to the three-phase brushless DC motor 3. The three-phase inverter circuit 5 includes switching elements 51a to 51f. The switching elements 51a to 51c are upper-arm switching elements, and are MOS transistors. The switching elements 51d to 51f are lower-arm switching elements, and are bidirectional switches. Note that diodes 53a to 53c, which are connected to the upper-arm switching elements 51a to 51c, respectively, are parasitic diodes of MOS transistors. A bidirectional switch as used herein is a switch that has a first operation mode in which the current is blocked in at least one direction, and a second operation mode in which the current is conducted in both directions. A bidirectional switch used in the present embodiment includes an S1 terminal, an S2 terminal, a G1 terminal and a G2 terminal, and the current flowing between S1 and S2 is controlled by voltages applied to G1 and G2.

The switching element 51a is a U-phase upper-arm switching element, the switching element 51b is a V-phase upper-arm switching element, and the switching element 51c is a W-phase upper-arm switching element. Similarly, the switching element 51d is a U-phase lower-arm switching element, the switching element 51e is a V-phase lower-arm switching element, and the switching element 51f is a W-phase lower-arm switching element.

The drains of the MOS transistors of the switching elements 51a, 51b and 51c are connected to the positive side of the DC power source 1. The source of the MOS transistor of the switching element 51a is connected to the U phase and S2 of the bidirectional switch of the switching element 51d. The source of the MOS transistor of the switching element 51b is connected to the V phase and S2 of the bidirectional switch of the switching element 51e. The source of the MOS transistor of the switching element 51c is connected to the W phase and S2 of the bidirectional switch of the switching element 51f. S1's of the bidirectional switches of the switching elements 51d, 51e and 51f are connected to the negative side of the DC power source 1.

Gate circuits 52a, 52b and 52c are connected respectively to the switching elements 51a, 51b and 51c, which are MOS transistors, and these are well known in the art.

Bidirectional switch gate circuits 52d, 52e and 52f are connected respectively to the switching elements 51d, 51e and 51f, which are bidirectional switches.

The gate controller 9 is a control circuit for controlling ON/OFF of the switching elements 51a to 51f via the gate circuits 52a to 52f so as to control the three-phase brushless DC motor 3 by a 120-degree-conduction-type PWM control. This is a well known gate controller, and will not be described.

The gate controller 9 allows the switching elements 51a to 51f of different phases to switch between conductive and non-conductive states based on the rotational angle of the three-phase brushless DC motor 3. Therefore, the rotational angle of the three-phase brushless DC motor 3 is estimated based on the three-phase AC voltage or current output from the three-phase inverter circuit 5 so as to perform a conductive phase switching control. The three-phase brushless DC motor 3 may be provided with a rotational angle sensor such as a resolver, and the conductive phase switching control may be performed based on the output signal thereof.

It is preferred that the gate controller 9 performs a torque control based on an externally-input torque command, or the like, so that the torque generated from the three-phase brushless DC motor 3 is controlled to be equal to the torque command, or the like. This can be done by, for example, detecting the three-phase AC current output from the three-phase inverter circuit 5, and PWM-controlling the upper-arm switching elements 51a to 51c each for an electrical angle of $2\pi/3$ so that the detected current becomes equal to the target current corresponding to the torque command.

(2) Configuration and Operation of Bidirectional Switch

Figure 2:
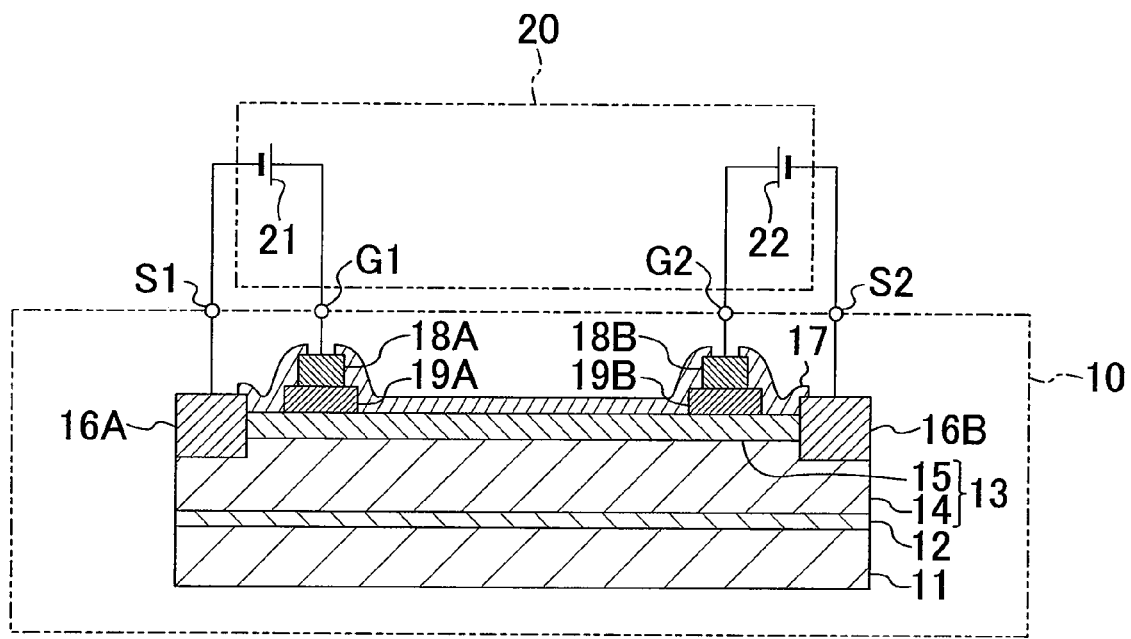
FIG. 2 A diagram showing a bidirectional switch and a gate circuit thereof according to the first embodiment of the present invention.

A bidirectional switch used in the first embodiment of the present invention will be described with reference to the drawings. FIG. 2 shows a configuration of a bidirectional switch of the first embodiment. As shown in FIG. 2, the bidirectional switch of the first embodiment is a double-gate semiconductor element 10, and is controlled by the control section 20.

The semiconductor element 10 includes the semiconductor layer stack 13 formed on the substrate 11 of silicon (Si) via the buffer layer 12 therebetween. The buffer layer 12 is obtained by alternately layering aluminum nitride (AlN) having a thickness of 10 nm and gallium nitride (GaN) having a thickness of 10 nm, and has a thickness of 1 μm. The semiconductor layer stack 13 includes the first semiconductor layer 14, and the second semiconductor layer 15 having a greater bandgap than the first semiconductor layer 14, layered in this order from the substrate side. In the present embodiment, the first semiconductor layer 14 is an undoped gallium nitride (GaN) layer having a thickness of 2 μm, and the second semiconductor layer 15 is an n-type aluminum gallium nitride (AlGaN) layer having a thickness of 20 nm.

Due to spontaneous polarization and piezopolarization, charges are generated near the heterojunction interface between the first semiconductor layer 14 and the second semiconductor layer 15. Thus, there is produced a channel region which is a two-dimensional electron gas (2DEG) layer having a sheet carrier concentration of $1\times10^{13}$ cm$^{-2}$ or more and a mobility of 1000 cm$^2$V/sec or more.

A first ohmic electrode 16A and a second ohmic electrode 16B are formed on the semiconductor layer stack 13 spaced apart from each other. The first ohmic electrode 16A and the second ohmic electrode 16B are obtained by layering together titanium (Ti) and aluminum (Al), and are in an ohmic contact with the channel region. FIG. 2 shows an example where portions of the second semiconductor layer 15 are removed and the first semiconductor layer 14 is dug down by about 40 nm so that the first ohmic electrode 16A and the second ohmic electrode 16B are in contact with the interface between the second semiconductor layer 15 and the first semiconductor layer 14, in order to reduce the contact resistance. Alternatively, the first ohmic electrode 16A and the second ohmic electrode 16B may be formed on the second semiconductor layer 15.

A first control layer 19A and a second control layer 19B, which are p-type semiconductor layers, are selectively formed spaced apart from each other on the n-type second semiconductor layer 15 in the region between the first ohmic electrode 16A and the second ohmic electrode 16B. A first gate electrode 18A is formed on the first control layer 19A, and a second gate electrode 18B is formed on the second control layer 19B. The first gate electrode 18A and the second gate electrode 18B are obtained by layering together palladium (Pd) and gold (Au), and are in an ohmic contact with the first control layer 19A and the second control layer 19B, respectively. A passivation film 17 of silicon nitride (SiN) is formed so as to cover the second semiconductor layer 15 and the first control layer 19A and the second control layer 19B. With the formation of the passivation film 17, it is possible to compensate for a defect that leads to a so-called "current collapse", thus improving the current collapse.

The first control layer 19A and the second control layer 19B are magnesium (Mg)-doped p-type GaN having a thickness of 300 nm. A pn junction is formed between the second semiconductor layer 15 and each of the first control layer 19A and the second control layer 19B. Thus, if the voltage between the first ohmic electrode 16A and the first gate electrode 18A is 0 V, for example, a depletion layer expands from the first control layer 19A into the channel region, whereby it is possible to block the current flow into the channel. Similarly, if the voltage between the second ohmic electrode 16B and the second gate electrode 18B is 0 V or less, for example, a depletion layer expands from the second control layer 19B into the channel region, whereby it is possible to block the current flow into the channel. Thus, there is realized a semiconductor element capable of a so-called "normally-off operation".

Assume that V1 denotes the potential of the first ohmic electrode 16A, V2 that of the first gate electrode 18A, V3 that of the second gate electrode 18B, and V4 that of the second ohmic electrode 16B. If V2 is higher than V1 by 1.5 V or more, the depletion layer expanding from the first control layer 19A into the channel region is shrunk, whereby it is possible to conduct a current through the channel region. Similarly, if V3 is higher than V4 by 1.5 V or more, the depletion layer expanding from the second control layer 19B into the channel region is shrunk, whereby it is possible to conduct a current through the channel region. Thus, a so-called "threshold voltage" of the first gate electrode 18A and that of the second gate electrode 18B are both 1.5 V. Hereinafter, a first threshold voltage is defined to be a threshold voltage of the first gate electrode such that the depletion layer expanding in the channel region below the first gate electrode 18A is shrunk so that a current can be conducted through the channel region, and a second threshold voltage is defined to be a threshold voltage of the second gate electrode such that the depletion layer expanding in the channel region below the second gate electrode 18B is shrunk so that a current can be conducted through the channel region.

The distance between the first control layer 19A and the second control layer 19B is designed so that the semiconductor element can withstand the maximum voltage applied to the first ohmic electrode 16A and the second ohmic electrode 16B.

The control section 20 corresponds to the gate circuits 52$d$ to 52$f$ shown in FIG. 1, and includes a first power supply 21 connected between the first ohmic electrode 16A and the first gate electrode 18A, and a second power supply 22 connected between the second ohmic electrode 16B and the second gate electrode 18B.

An operation of the semiconductor element 10 of the first embodiment will now be described. It is assumed for the purpose of illustration that the potential of the first electrode is 0 V, the output voltage of a first power supply 21 is Vg1, the output voltage of the second power supply 22 is Vg2, the voltage between the second ohmic electrode 16B and the first ohmic electrode 16A is Vs2$s$1, and the current flowing between the second ohmic electrode 16B and the first ohmic electrode 16A is Is2$s$1.

Where V4 is higher than V1, e.g., where V4 is +100 V and V1 is 0 V, the output voltages Vg1 and Vg2 of the first power supply 21 and the second power supply 22 are set to voltages less than or equal to the first threshold voltage and the second threshold voltage, respectively, e.g., 0 V. Then, the depletion layer expanding from the first control layer 19A expands through the channel region in the direction toward the second p-type GaN layer, whereby it is possible to block the current flowing through the channel. Thus, even if V4 is a positive high voltage, it is possible to realize a non-conductive state where the current flowing from the second ohmic electrode 16B to the first ohmic electrode 16A is blocked.

Also where V4 is lower than V1, e.g., where V4 is −100 V and V1 is 0 V, the depletion layer expanding from the second control layer 19B expands through the channel region in the direction toward the first control layer 19A, whereby it is possible to block the current flowing through the channel. Therefore, even if a negative high voltage is applied to the second ohmic electrode 16B, it is possible to block the current flowing from the first ohmic electrode to the second ohmic electrode. Thus, it is possible to block the current in both directions.

With the structure and operation as described above, the channel region for ensuring the breakdown voltage is shared by the first gate electrode and the second gate electrode. With the element of the present embodiment, a bidirectional switch element can be implemented with only the area of the channel region for one element, and in view of the whole bidirectional switch, the chip area can be reduced as compared with a case where two diodes and two normally-off type AlGaN/GaN-HFETs are used, thus enabling a reduction in the cost and size of the bidirectional switch.

Where the output voltages Vg1 and Vg2 of the first power supply 21 and the second power supply 22 are higher than the first threshold voltage and the second threshold voltage, respectively, e.g., 5 V, the voltages applied to the first gate electrode 18A and the second gate electrode 18B are both higher than the threshold voltage. Therefore, the depletion layer does not expand from the first control layer 19A and the second control layer 19B into the channel region, whereby the channel region is not pinched off under the first gate electrode 18A or under the second gate electrode 18B. As a result, it is possible to realize a conductive state in which the current flows in both directions between the first ohmic electrode 16A and the second ohmic electrode 16B.

Figure 3:
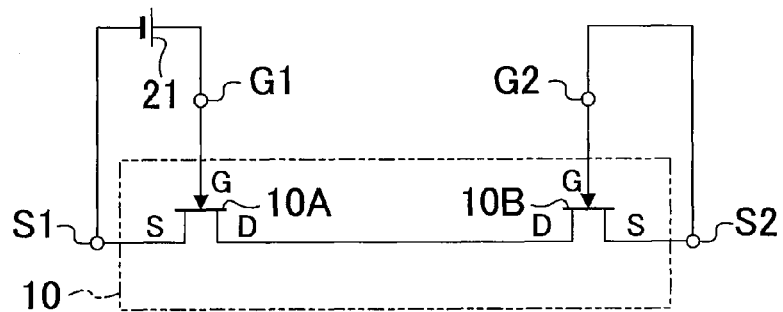
FIG. 3 Diagrams each showing an equivalent circuit of the bidirectional switch according to the first embodiment of the present invention.
Figure 3:
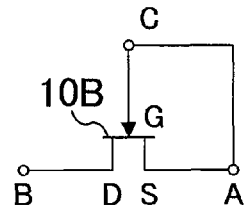
Figure 3:
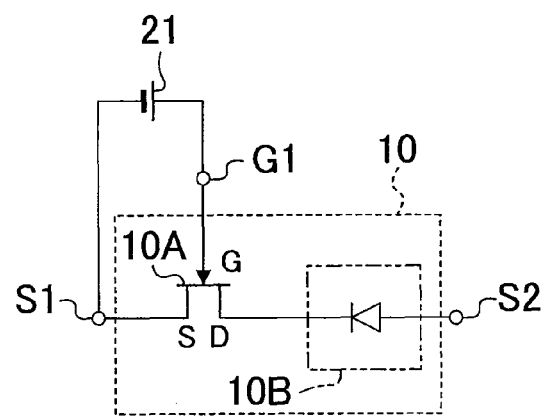

Next, an operation where Vg1 is a voltage higher than the first threshold voltage and Vg2 is less than or equal to the second threshold voltage will be described. In an equivalent circuit representation, the double-gate semiconductor element 10 of the present embodiment can be regarded as a circuit including a first transistor 10A and a second transistor 10B connected together in series, as shown in FIG. 3(a). In this case, the source (S) of the first transistor 10A correspond to the first ohmic electrode 16A, the gate (G) of the first transistor 10A to the first gate electrode 18A, the source (S) of the second transistor 10B to the second ohmic electrode 16B, and the gate (G) of the second transistor 10B to the second gate electrode 18B.

Where Vg1 is 5 V and Vg2 is 0 V, for example, in such a circuit, since Vg2 being 0 V is equivalent to a state where the gate and the source of the second transistor 10B are shorted with each other, the semiconductor element 10 can be regarded as a circuit shown in FIG. 3(b).

It is assumed in the following description that the source (S) of the second transistor shown in FIG. 3(b) is the A terminal, the drain (D) is the B terminal, and the gate (G) is the C terminal.

If the potential of the B terminal is higher than the potential of the A terminal, it can be regarded as a transistor in which the A terminal is the source and the B terminal is the drain. Then, since the voltage between the C terminal (gate) and the A terminal (source) is 0 V, less than or equal to the threshold voltage, no current flows from the B terminal (drain) to the A terminal (source).

If the potential of the A terminal is higher than the potential of the B terminal, it can be regarded as a transistor in which the B terminal is the source and the A terminal is the drain. In such a case, since the C terminal (gate) and the A terminal (drain) are at the same potential, when the potential of the A terminal is less than or equal to the threshold voltage with reference to the potential of the B terminal, no current is conducted from the A terminal (drain) to the B terminal (source). When the potential of the A terminal becomes greater than or equal to the threshold voltage with reference to the potential of the B terminal, a voltage greater than or equal to the threshold voltage with reference to the potential of the B terminal (source) is applied to the gate, whereby a current can be conducted from the A terminal (drain) to the B terminal (source).

That is, when the gate and the source of the transistor are shorted with each other, the circuit functions as a diode in which the drain is the cathode and the source is the anode, with the threshold voltage of the transistor being the forward turn-ON voltage of the diode.

Therefore, a portion of the second transistor 10B shown in FIG. 3(a) can be regarded as a diode, and is represented as an equivalent circuit shown in FIG. 3(c). In the equivalent circuit shown in FIG. 3(c), where the potential of the drain of the bidirectional switch is higher than the potential of the source, if 5 V is being applied to the gate of the first transistor 10A, the first transistor 10A is ON, and a current can be conducted from S2 to S1. However, there occurs an ON voltage due to the forward turn-ON voltage of the diode. If the potential of S1 of the bidirectional switch element is higher than the potential of S2, the diode including the second transistor 10B bears the voltage, thus blocking the current flow from S1 to S2 of the bidirectional switch element. Thus, it is possible to realize a switch capable of a so-called "diode operation" by giving a voltage greater than or equal to the threshold voltage to the first gate and giving a voltage less than or equal to the threshold voltage to the second gate.

Figure 4:
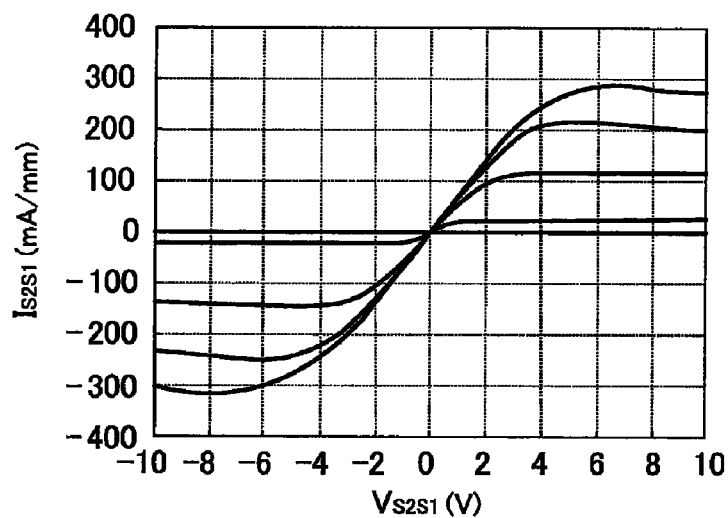
FIG. 4 Graphs each showing current-voltage characteristics of the bidirectional switch according to the first embodiment of the present invention.
Figure 4:
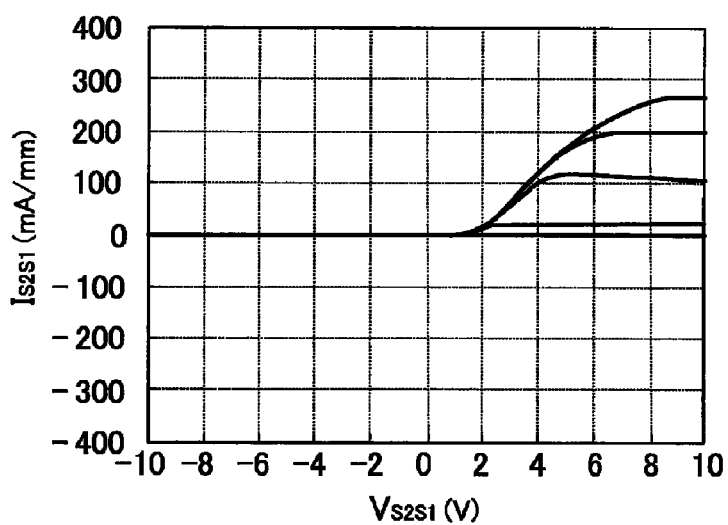
Figure 4:
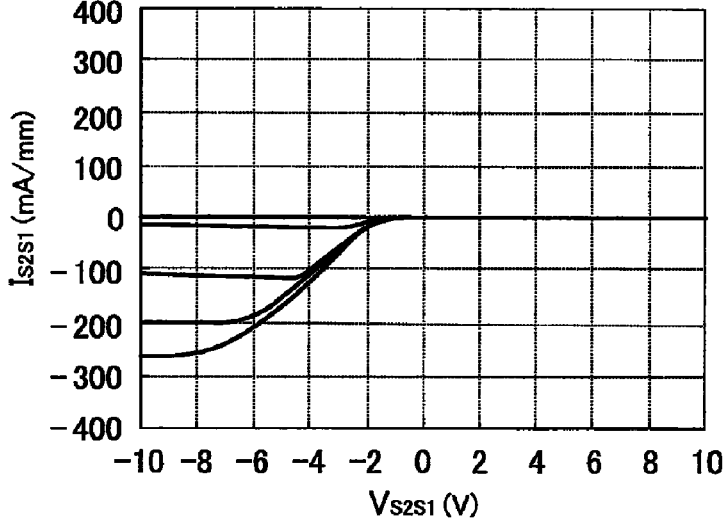

FIG. 4 shows the relationship between Vs2s1 and Is2s1 of the semiconductor element 10, wherein (a) shows a case where Vg1 and Vg2 are varied at the same time, (b) shows a case where Vg1 is varied while Vg2 is set to 0 V, which is less than or equal to the second threshold voltage, and (c) shows a case where Vg2 is varied while Vg1 is set to 0 V, which is less than or equal to the first threshold voltage. Note that the S2-S1 voltage (Vs2s1) along the horizontal axis in FIG. 4 is a voltage with reference to the first ohmic electrode 16A, and the S2-S1 current (Is2s1) along the vertical axis is plotted assuming the positive direction is the direction of a current flow from the second ohmic electrode 16B toward the first ohmic electrode 16A.

As shown in FIG. 4(a), when Vg1 and Vg2 are 0 V or 1 V, Is2s1 does not flow whether Vs2s1 is positive or negative, whereby the semiconductor element 10 is in a non-conductive state. When Vg1 and Vg2 are both higher than the threshold voltage, a conductive state is reached where Is2s1 flows in both directions according to Vs2s1.

As shown in FIG. 4(b), where Vg2 is set to 0 V, which is less than or equal to the second threshold voltage, and where Vg1 is set to 0 V, which is less than or equal to the first threshold voltage, Is2s1 is blocked in both directions. However, where Vg1 is set to 2 V to 5 V, which is greater than or equal to the first threshold voltage, Is2s1 does not flow when Vs2s1 is less than 1.5 V, but Is2s1 flows when Vs2s1 is greater than or equal to 1.5 V. Thus, a reverse-blocking state is reached where a current flows only from the second ohmic electrode 16B to the first ohmic electrode 16A, but not from the first ohmic electrode 16A to the second ohmic electrode 16B. Where Vg2 is varied while Vg1 is set to 0 V, as shown in FIG. 4(c), a reverse-blocking state is reached where a current flows only from the first ohmic electrode 16A to the second ohmic electrode 16B, but not from the second ohmic electrode 16B to the first ohmic electrode 16A.

As described above, depending on the gate bias conditions, the semiconductor element 10 can function as a bidirectional switch blocking/conducting the current in both directions and can perform a diode operation, wherein the current-conducting direction of the diode can also be switched.

The bidirectional switch of the first embodiment includes the first gate electrode 18A formed on the first control layer 19A having the p-type conductivity, and the second gate electrode 18B formed on the second control layer 19B having the p-type conductivity. Therefore, by applying a forward bias from the first gate electrode 18A and the second gate electrode 18B to a channel region that is produced in an interface region between the first semiconductor layer 14 and the second semiconductor layer 15, holes can be injected into the channel region. Since hole mobility is much lower than electron mobility in a nitride semiconductor, holes injected into the channel region hardly contribute as a current carrier. Therefore, the holes injected from the first gate electrode 18A and the second gate electrode 18B generate the same amount of electrons in the channel region, thereby increasing the effect of generating electrons in the channel region, and thus act like donor ions. In other words, since a carrier concentration can be modulated in the channel region, a normally-off type nitride semiconductor layer bidirectional switch having a large operating current can be realized.

The present device is similar in structure to a JFET, but the carrier injection is done intentionally and the present device is therefore totally different in operation principles from a JFET, which realizes carrier modulation in the channel region by means of the gate electric field. Specifically, it operates as a JFET up to a gate voltage of 3 V, but where there is applied a gate voltage of 3 V or more, exceeding the built-in potential of the pn junction, holes are injected into the gate, thus increasing the current by the above-described mechanism, thereby realizing an operation with a large current and a low ON-resistance. Moreover, with the present bidirectional switch, holes can be injected from two gate electrodes, i.e., the first gate electrode and the second gate electrode. Therefore, it is possible to further increase the current and reduce the ON-resistance as compared with those of a single-gate FET.

Note that since the present bidirectional switch uses, in the semiconductor layer thereof, GaN, which has a higher breakdown field than that of Si, it is possible to realize a bidirectional switch capable of achieving both a lower ON-resistance and a higher breakdown voltage than those of an Si device. In the present bidirectional switch, the distance between the first control layer 19A and the second control layer 19B, which dictates the breakdown voltage, is set to 7.5 μm. As described above, even where the channel region is short, since GaN having a higher breakdown field than Si is used, it is possible to obtain a higher breakdown voltage than that obtained when Si is used. Moreover, since it is possible to shorten the channel region, it is possible to reduce the ON-resistance.

(3) Bidirectional Switch Gate Circuit

Figure 5:
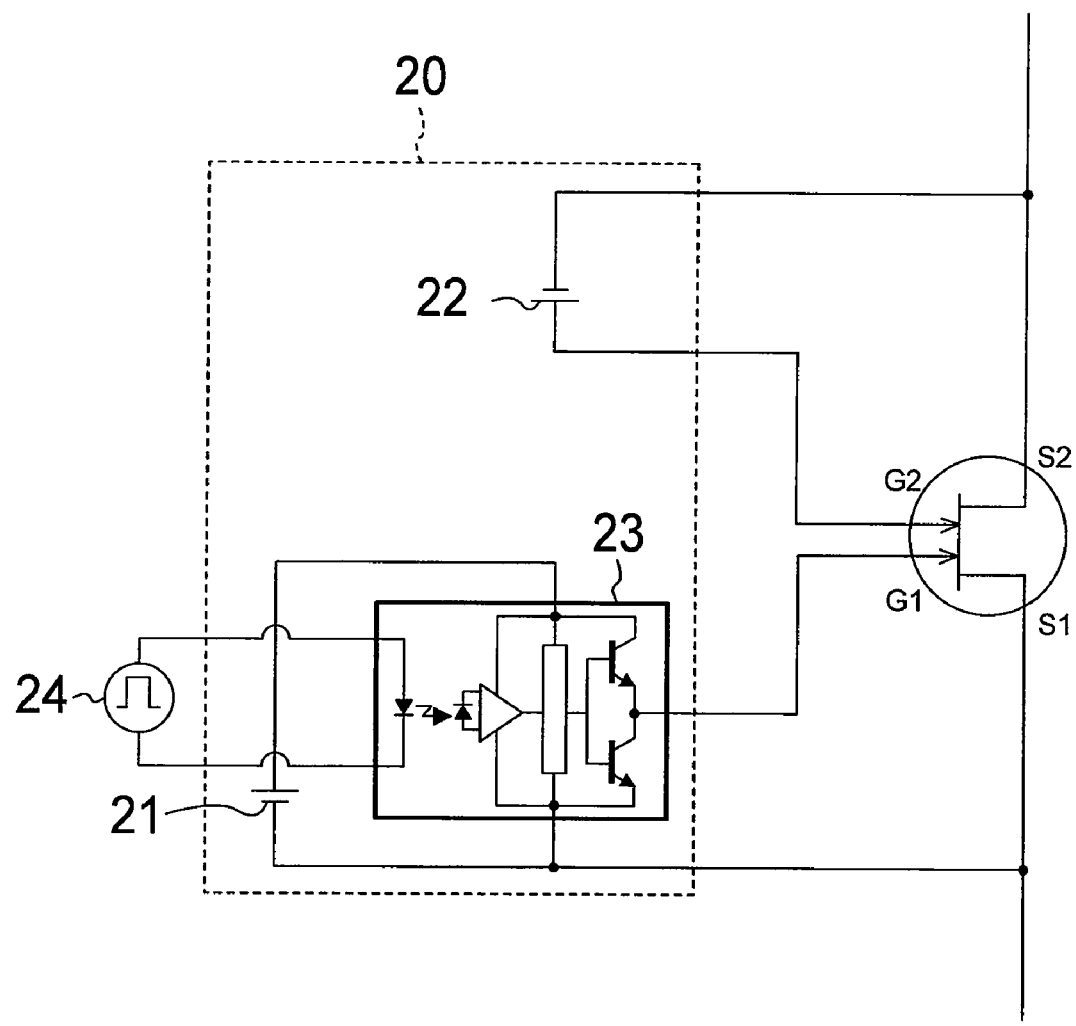
FIG. 5 A diagram showing a gate driving circuit according to the first embodiment of the present invention.

FIG. 5 shows an example of a circuit configuration of the control section 20, which is a bidirectional switch gate circuit illustrated in the present embodiment. The bidirectional switch control section 20 includes the first power supply 21, the second power supply 22, and a gate driving circuit 23 having a photocoupler therein.

The first power supply 21 and the second power supply 22 are each an insulated-type power supply, and outputting a voltage greater than or equal to the threshold voltage, e.g., 5 V. The gate driving circuit 23 includes a photocoupler, including a light emitting diode (LED) and a photodiode, and can be switched ON/OFF by an external control signal, and the control signal and the switch output can be electrically separated from each other. FIG. 5 shows an example where an integrated circuit including a gate driving circuit therein is used. The integrated circuit may be any of those commercially available, and may be, for example, Photocoupler TLP251 from Toshiba Corporation. Moreover, it is not limited to an integrated circuit including a gate driving circuit therein, but may be any circuit as long as it is a switch capable of electrically separating the control signal and the switch output from each other.

The second power supply 22 outputs 5 V, and is connected between S2 and G2 of the bidirectional switch. The first power supply 21 is connected between G1 and S1 via the gate driving circuit 23. A control signal source 24 of the gate controller 9 in FIG. 1 is connected to the LED of the gate driving circuit 23 having a photocoupler therein.

With such a configuration, a control signal is electrically insulated, and by using insulated-type power supplies as the first power supply 21 and the second power supply 22, the bidirectional switch of the present embodiment can be driven whether it is used as an upper-arm switching element or as a lower-arm switching element. There is 5 V always applied between S2-G2, and G2 remains ON. Therefore, when the control signal source 24 is outputting an OFF signal, the gate driving circuit 23 having a photocoupler therein electrically shorts G1 and S1 together, and 0 V is applied between S1-G1, thereby turning G1 OFF. In this state, S2 serves as the cathode and S1 as the anode, as described above, and the bidirectional switch operates as a diode whose forward turn-ON voltage is equal to the threshold voltage of the first gate.

When the control signal source 24 is outputting an ON signal, the gate driving circuit 23 having a photocoupler therein applies 5 V between G1 and S1, thereby turning G1 ON. In this state, the bidirectional switch can conduct a current in both directions with such a small ON-resistance that no offset voltage is generated between S2 and S1, as described above.

As described above, it operates as a diode with S2 serving as the cathode and S1 as the anode when G1 is OFF, and as an FET that conducts a current in both directions when G1 is ON.

Hereinafter, the bidirectional switch being OFF means that it performs a first operation as a diode that conducts a current only in one direction with S2 serving as the cathode and S1 as the anode, and the bidirectional switch being ON means that it performs a second operation in which a current is conducted in both directions with such a small ON-resistance that no offset voltage is generated between S2 and S1.

Note that where the bidirectional switch is used on the lower arm side and GND is shared between the DC power source and the gate controller, the gate bias voltage may be directly applied between G1-S1 from the control signal source of the gate controller without passing through the gate driving circuit having a photocoupler therein, and the power supply for gate bias may be a non-insulated-type power supply.

Note that the insulated-type power supply may be a DC/DC converter using a transformer. Alternatively, a bootstrap circuit may be formed by a capacitor, a resistor and a diode, and the capacitor may be used as a virtual insulated power supply.

(4) Operation of Inverter Circuit

A PWM control operation of the 120-degree conduction method performed by the gate controller 9 of FIG. 1 will now be described with reference to the timing diagram shown in FIG. 6.

The upper-arm switching elements 51a to 51c each have a PWM control period of an electrical angle of 2π/3, alternating with one another. The PWM control period is divided into pulse periods, each of which is the inverse of the predetermined carrier frequency, and the upper-arm switching element is turned ON during a predetermined pulse width period set in each pulse period and OFF during each pulse interval period. The PWM control is performed by adjusting the pulse width period.

Moreover, the upper-arm switching element 51a is PWM-controlled during the period t0-t2, the upper-arm switching element 51b is PWM-controlled during the next period t2-t4, and the upper-arm switching element 51c is PWM-controlled during the next period t4-t6. That is, t0-t2 is the PWM control period for the switching element 51a, t2-t4 is the PWM control period for the switching element 51b, and t4-t6 is the PWM control period for the switching element 51c. The lower-arm switching element 51e remains continuously conductive during the period t5-t1, the lower-arm switching element 51f remains continuously conductive during the next period t1-t3, and the lower-arm switching element 51d remains continuously conductive during the next period t3-t5. That is, t5-t1 is the continuous conduction period for the switching element 51e, t1-t3 is the continuous conduction period for the switching element 51f, and t3-t5 is the continuous conduction period for the switching element 51d.

In the PWM control period, each of the lower-arm switching elements 51d to 51f is turned ON during the OFF period, i.e., the pulse interval period, of one of the upper-arm switching elements 51a to 51c of the same phase, and is turned OFF during the pulse width period thereof. That is, in the present embodiment, an upper-arm switching element and a lower-arm switching element of the same phase perform a complementary operation in the PWM control period.

The current flow will now be described with reference to FIGS. 7(a) and 7(b). FIG. 7(a) shows a case where the upper-arm switching element 51a is ON during the period t0-t1 of FIG. 6. The current flowing from the switching element 51a to the three-phase brushless DC motor 3 recirculates to the DC power source through the switching element 51e. At this time, a magnetic energy is accumulated in the stator coil of the three-phase brushless DC motor 3.

Figure 6:
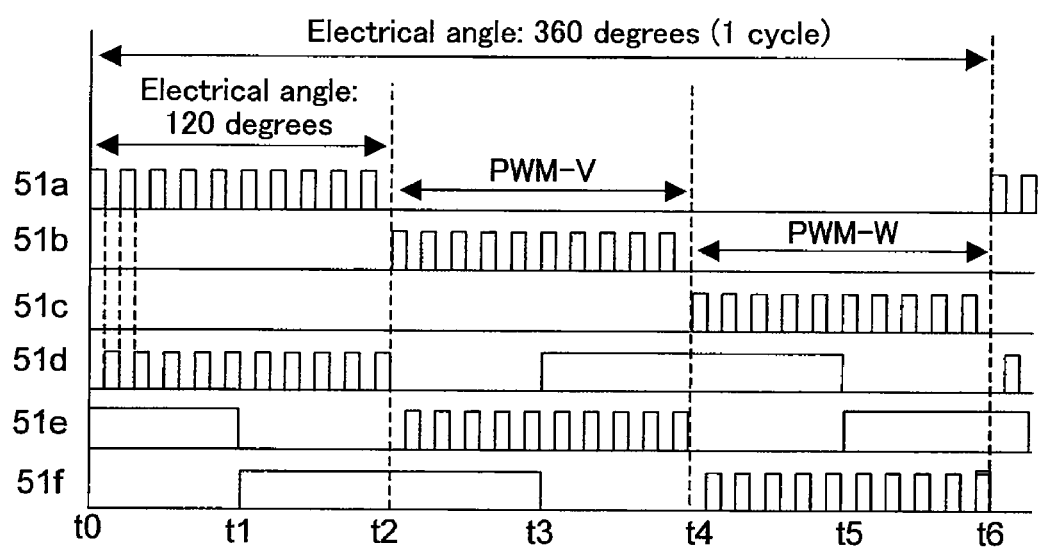
FIG. 6 A timing diagram of an operation of the motor driving circuit according to the first embodiment of the present invention.
Figure 7:
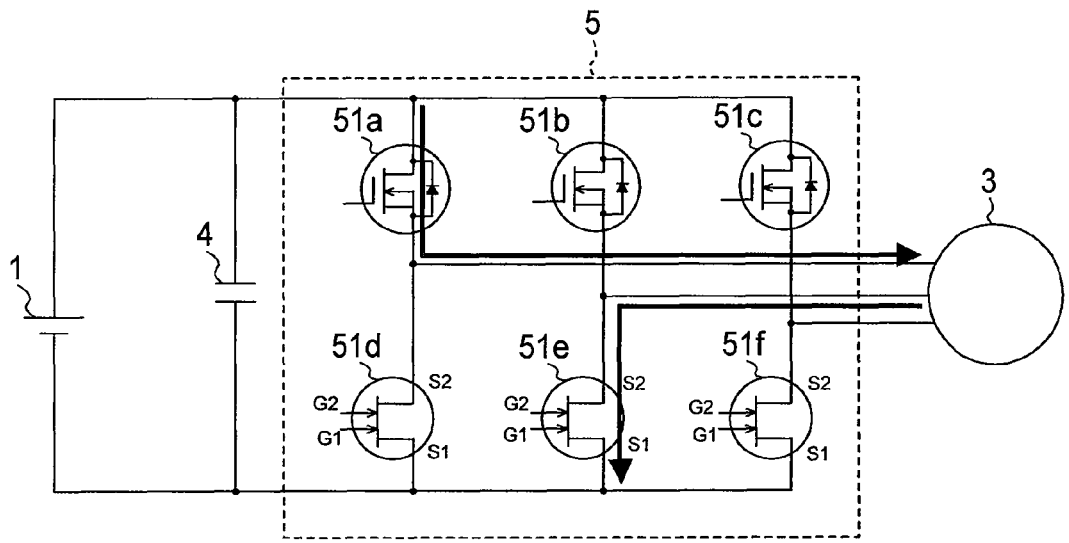
FIGS. 7 (a) and (b) each show a current flow during an operation of the motor driving circuit according to the first embodiment of the present invention, wherein (a) is a diagram showing the operation during the pulse width period for the upper-arm switching elements, and (b) is a diagram showing the operation during the pulse interval period for the upper-arm switching elements.
Figure 7:
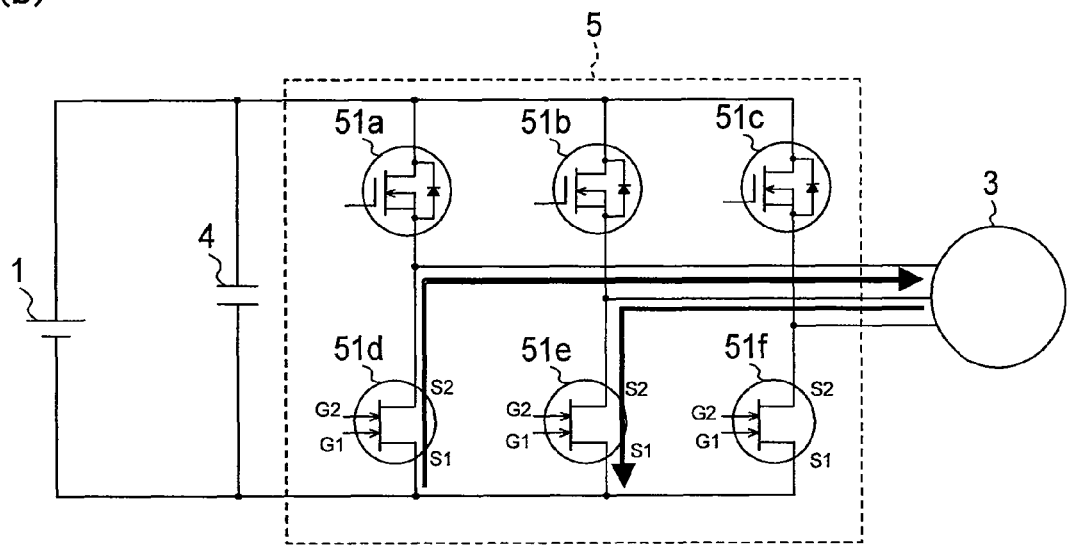

FIG. 7(b) shows a case where the upper-arm switching element 51a is OFF during the period t0-t1 of FIG. 6. Due to the magnetic energy accumulated in the stator coil of the three-phase brushless DC motor 3, a flywheel current recirculates through the switching element 51d and the three-phase brushless DC motor 3 and the switching element 51e. The switching element 51d is a bidirectional switch, which when being OFF is in a diode state in which S2 serves as the cathode and S1 as the anode and where the forward turn-ON voltage is equal to the threshold voltage of the second gate, as described above. Therefore, when the switching element 51d is OFF, the flywheel current flows from S1 to S2. Therefore, a substantial loss occurs due to the high forward turn-ON voltage (1.5V). On the other hand, when the bidirectional switch is ON, it can operate as an FET having current-voltage characteristics with no offset voltage. During the period t0-t1 shown in FIG. 6, when the switching element 51a is OFF, the switching element 51d is ON, whereby it operates as an FET, which can be turned conductive with a small ON voltage and can conduct a flywheel current with a small loss. Moreover, the heat generation due to the diode can be reduced significantly, and it is possible to simplify the cooling mechanism and increase the efficiency of the inverter. Of course, the ON-resistance when the bidirectional switch is operating as an FET is set so that the ON voltage where the bidirectional switch is operated as an FET and a flywheel current is conducted is lower than the ON voltage when the bidirectional switch is operating as a diode.

While only the U-phase PWM control period has been described above, the remaining two phases will not be described below as the same holds true also for these phases.

Moreover, in FIG. 6, it is preferred that the switching elements 51a and 51d of the same phase are each turned ON after the other is turned completely or almost OFF in the PWM control period of itself. It is preferred that a dead time is provided in the switching period, during which the switching elements 51a and 51d are both OFF. With the provision of such a dead time, it is possible to prevent the short-circuit of the power supply and a substantial power loss due to the two switching elements being ON at the same time. Note that also during the dead time, the switching element 51d, which is a bidirectional switch, is OFF, where it operates as a diode. Therefore, a flywheel current can be conducted from S1 to S2, and the current flowing into the inductance is not blocked abruptly, whereby it is possible to prevent the switching element 51d from breaking down. Note that while the U-phase arm operation has been described above, the same holds true for the switching element operation for the V-phase arm and the W-phase arm. Note that in FIG. 6, PWM-U, PWM-V and PWM-W each denote the PWM control period of the corresponding phase.

Note that the switching elements 51d, 51e and 51f have no parasitic diode, and the flywheel current flows into the switching elements themselves. Therefore, where the switching element is operated as a diode, it exhibits better recovery characteristics than an FRD. Therefore, it is possible to reduce the switching loss due to the recovery current, and it is possible to reduce the inverter loss.

Note that no current normally flows through the parasitic diode of the switching element 51a, and there is no heat generation therein. Therefore, a normal transistor such as a MOS transistor can be used, and it is only necessary to control a single gate, thereby simplifying the gate circuit.

While FIG. 1 shows an example where the upper-arm switching element is a MOS transistor, the upper-arm switching element may be an IGBT with a flywheel diode connected thereto in a reverse position, a bipolar transistor with a flywheel diode connected thereto in a reverse position, or a normally-off field effect transistor using a nitride semiconductor with a flywheel diode connected thereto in a reverse parallel position. When a normally-off field effect transistor using a nitride semiconductor is used, no flywheel diode may be connected thereto, as described in the second embodiment.

Note that a bidirectional switch of the lower-arm switching element can operate as a diode, and therefore requires no external diode connected in a reverse parallel position for conducting a flywheel current, thereby providing an advantage that an inverter circuit can be implemented at a lower cost.

Note that while the present embodiment shows an example operation of transitioning from the diode operation to the FET operation by performing a complementary operation using the switching elements 51d, 51e and 51f, it is not necessary to perform a complementary operation. Specifically, the switching element 51d may only perform the diode operation during the PWM-U period, the switching element 51e may only perform the diode operation during the PWM-V period, and the switching element 51f may only perform the diode operation during the PWM-W period.

(First Variation of First Embodiment)

Figure 8:
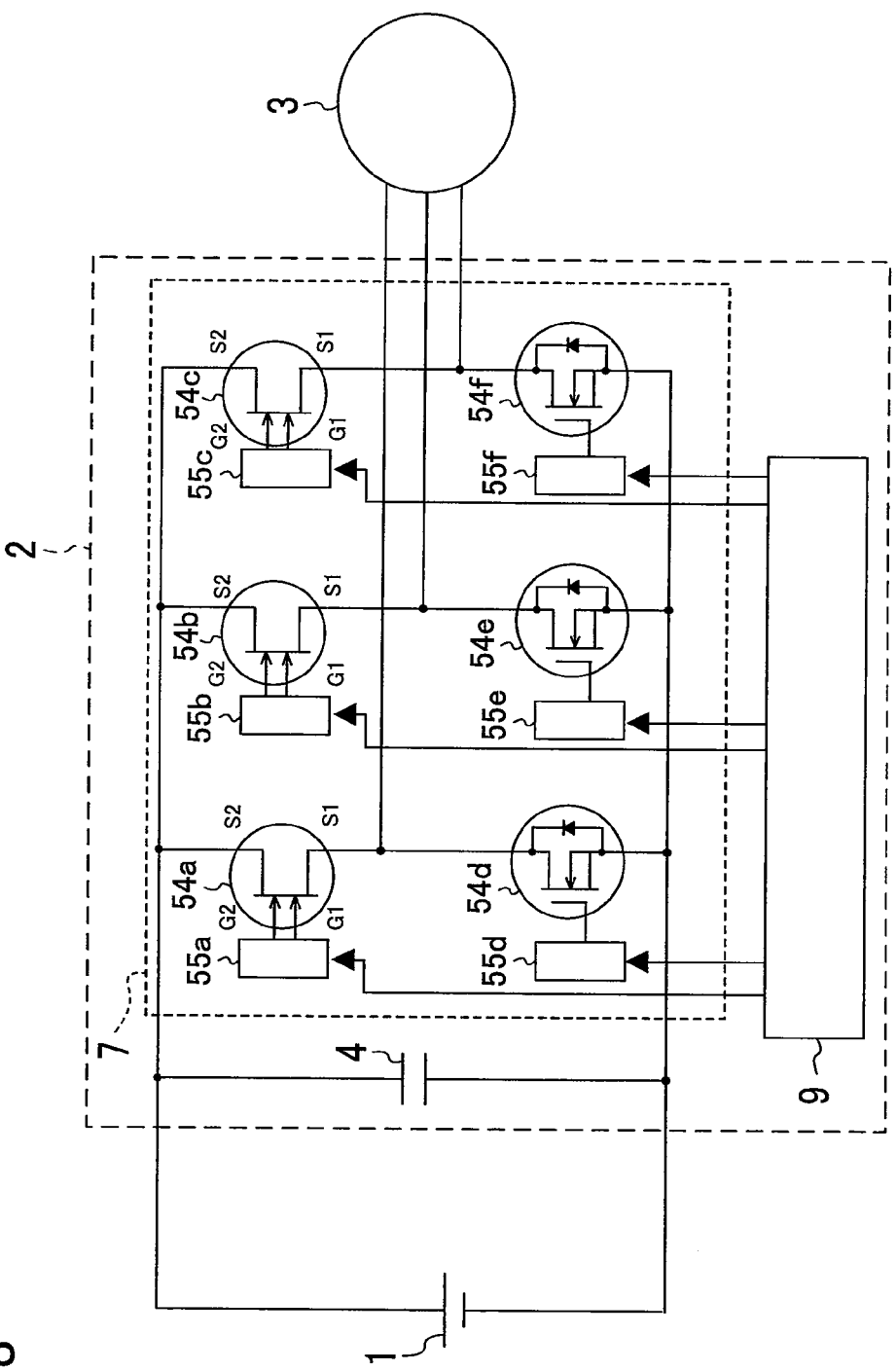
FIG. 8 A circuit diagram showing a motor driving circuit according to a first variation of the first embodiment of the present invention.
Figure 9:
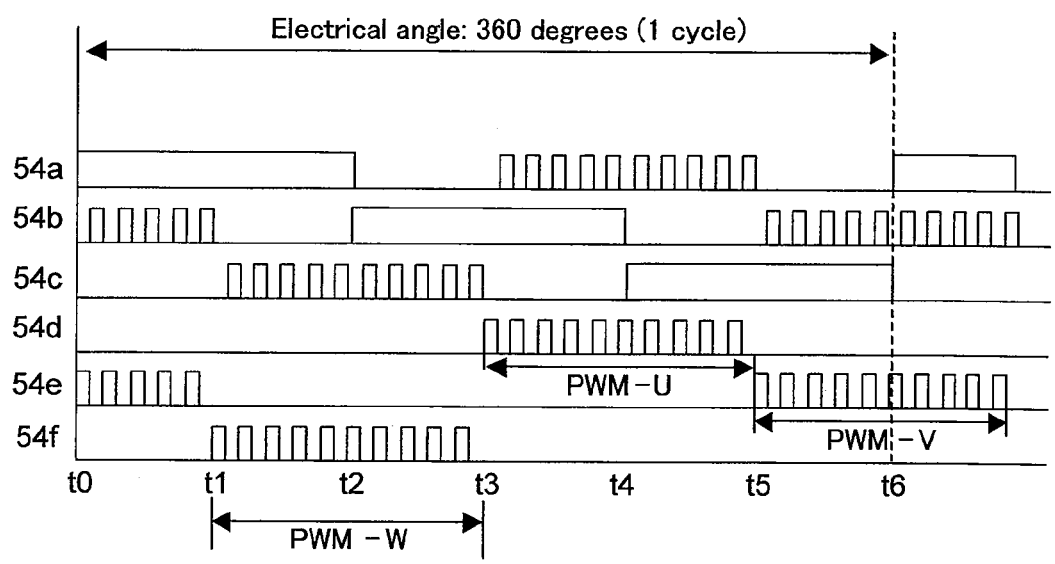
FIG. 9 A timing diagram of an operation of the motor driving circuit according to the first variation of the first embodiment of the present invention.

The first embodiment has been directed to a case where the upper-arm switching element is a MOS transistor and the lower-arm switching element is a bidirectional switch, wherein the upper-arm switching element is PWM-controlled. This variation is directed to an example where the upper-arm switching element is a bidirectional switch and the lower-arm switching element is a MOS transistor, wherein the lower-arm switching element is PWM-controlled. FIG. 8 shows a circuit diagram of this case, and FIG. 9 shows a timing diagram thereof.

A three-phase inverter circuit 7 is a DC-AC conversion circuit for converting an applied DC voltage to a three-phase AC voltage and outputting the three-phase AC voltage to the three-phase brushless DC motor 3, and includes the switching elements 54a to 54c, which are bidirectional switches, and the switching elements 54d to 54f, which are MOS transistors.

The switching element 54a is a U-phase upper-arm switching element, the switching element 54b a V-phase upper-arm switching element, and the switching element 54c a W-phase upper-arm switching element. Similarly, the switching element 54d is a U-phase lower-arm switching element, the switching element 54e a V-phase lower-arm switching element, and the switching element 54f a W-phase lower-arm switching element.

S2's of the bidirectional switches of the switching elements 54a, 54b and 54c are connected to the positive side of the DC power source 1. S1 of the bidirectional switch of the switching element 54a is connected to the U phase and the drain of the MOS transistor of the switching element 54d. S1 of the bidirectional switch of the switching element 54b is connected to the V phase and the drain of the MOS transistor of the switching element 54e. S1 of the bidirectional switch of the switching element 54c is connected to the W phase and the drain of the MOS transistor of the switching element 54f. S1's of the bidirectional switches of the switching elements 54d, 54e and 54f are connected to the negative side of the DC power source 1.

The bidirectional switch gate circuits 55a, 55b and 55c are connected to the bidirectional switches of the switching elements 54a, 54b and 54c, and these may be the same as the gate circuit described in the first embodiment.

The gate circuits 55d, 55e and 55f are connected respectively to the MOS transistors of the switching elements 54d, 54e and 54f, and these are well known in the art.

A PWM control operation of the 120-degree conduction method performed by the gate controller 9 in such a three-phase inverter circuit 7 will be described with reference to FIG. 8.

The lower-arm switching elements 54d to 54f are PWM-controlled, one after another, each for an electrical angle of 120 degrees, and the upper-arm switching elements 54a to 54c are turned continuously conductive each for an electrical angle of 120 degrees. In this way, it is possible to suppress a loss occurring at the diode, suppress the heat generation, increase the efficiency of the inverter, and reduce the size of the cooling mechanism, as with the inverter circuit of the first embodiment.

Second Embodiment

A second embodiment of the present invention will now be described with reference to the drawings.

(1) Configuration of Motor Driving Circuit

Figure 10:
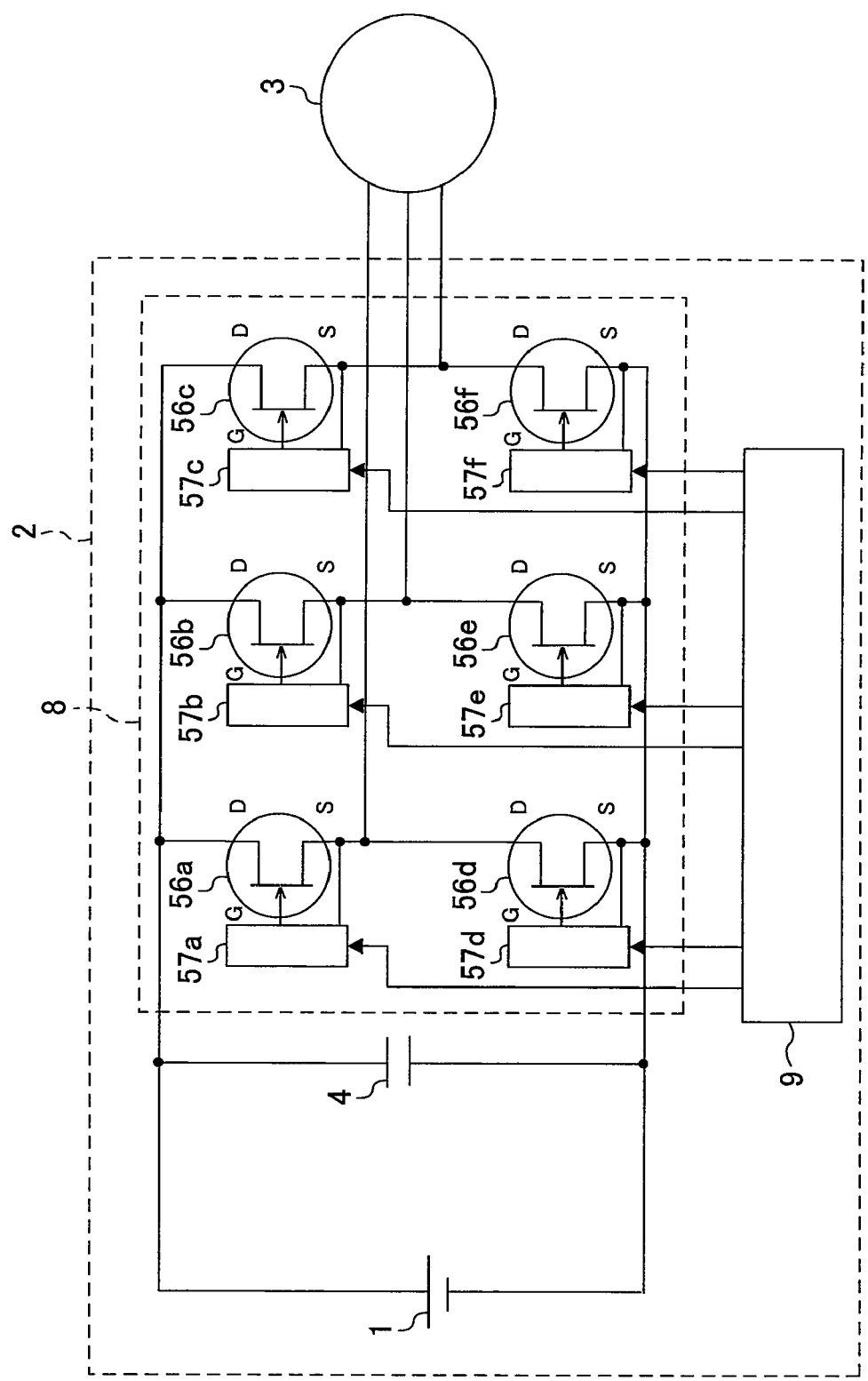
FIG. 10 A circuit diagram showing a motor driving circuit according to a second embodiment of the present invention.

A circuit in a motor driving circuit of the present embodiment will now be described with reference to FIG. 10. FIG. 10 is a diagram showing a motor driving circuit for driving a three-phase brushless DC motor. As shown in FIG. 10, a motor driving circuit 2 of the second embodiment receives DC power supplied from a DC power source 1 to drive a three-phase brushless DC motor, which is a permanent magnet synchronous motor.

The motor driving circuit 2 includes a smoothing capacitor 4, a three-phase inverter circuit 8, and a gate controller 9.

A three-phase brushless DC motor 3 includes a U-phase coil, a V-phase coil and a W-phase coil connected together in a start connection (or a delta connection), and the rotor is equipped with a predetermined number of pairs of field magnets.

The three-phase inverter circuit 8 is a DC-AC conversion circuit for converting the DC voltage applied from the DC power source 1 to a three-phase AC voltage and outputting the three-phase AC voltage to the three-phase brushless DC motor 3, and includes the switching elements 56a to 56f, which are bidirectional switches. A bidirectional switch as used herein is a switch that has a first operation mode in which the current is blocked in at least one direction, and a second operation mode in which the current is conducted in both directions.

The bidirectional switch used in the present invention includes the drain (D), which is a first ohmic electrode, the source (S), which is second ohmic electrode, and the gate (G), and controls the current flowing between the drain and the source by the voltage and the current applied to the gate.

The switching element 56a is a U-phase upper-arm switching element, the switching element 56b a V-phase upper-arm switching element, and the switching element 56c a W-phase upper-arm switching element. Similarly, the switching element 56d is a U-phase lower-arm switching element, the switching element 56e a V-phase lower-arm switching element, and the switching element 56f a W-phase lower-arm switching element.

The drains of the switching elements 56a, 56b and 56c are connected to the positive side of the DC power source 1. The source of the switching element 56a is connected to the U phase and the drain of the switching element 56d. The source of the switching element 56b is connected to the V phase and the drain of the switching element 56e. The source of the switching element 56c is connected to the W phase and the drain of the switching element 56f. The sources of the switching elements 56d, 56e and 56f are connected to the negative side of the DC power source 1.

Upper-arm gate circuits 57a, 57b and 57c are connected to the switching elements 56a, 56b and 56c, respectively. An upper-arm gate circuit includes a level shift circuit that is electrically insulated from the reference potential of the input signal and is capable of transmitting a signal to a circuit of a different potential, a floating gate driving circuit, and an insulated power supply for gate bias. The control signal input from the gate controller is input to the gate circuit via the level shift to apply the voltage and the current supplied from the insulated power supply between the gate and the source of the switching element, thereby controlling the switching elements 56a, 56b and 56c. These gate circuits may be those well known in the art.

Lower-arm gate circuits 57d, 57e and 57f are connected to the switching elements 56d, 56e and 56f. A lower-arm gate circuit includes a gate driving circuit, and a power supply for gate bias. The control signal input from the gate controller is input to the gate circuit to apply the voltage and the current supplied from the power supply between the gate and the source of the switching element, thereby controlling the switching elements 56d, 56e and 56f. These gate circuits may be those well known in the art.

The gate controller 9 is a control circuit for controlling ON/OFF of the switching elements 56a to 56f via the gate circuits 57a to 57f so as to perform a 120-degree-conduction-type PWM control on the three-phase brushless DC motor 3. This is a well known gate controller, and will not be described below.

The gate controller 9 allows the switching elements 56a to 56f of different phases to switch between conductive and non-conductive states based on the rotational angle of the three-phase brushless DC motor 3. Therefore, the rotational angle of the three-phase brushless DC motor 3 is estimated based on the three-phase AC voltage or current output from the three-phase inverter circuit 8 so as to perform a conductive phase switching control. The three-phase brushless DC motor 3 may be provided with a rotational angle sensor such as a resolver, and the conductive phase switching control may be performed based on the output signal thereof.

It is preferred that the gate controller 9 performs a torque control based on an externally-input torque command, or the like, so that the torque generated from the three-phase brushless DC motor 3 is controlled to be equal to the torque command, or the like. This can be done by, for example, detecting the three-phase AC current output from the three-phase inverter circuit 8, and PWM-controlling the upper-arm switching elements 56a to 56c each for an electrical angle of $2\pi/3$ so that the detected current becomes equal to the target current corresponding to the torque command.

(2) Configuration and Operation of Switching Element

A switching element, which is the bidirectional switch used in the second embodiment of the present invention, will be described with reference to the drawings. FIGS. 11(a) and 11(b) show the structure of the switching element of the present embodiment, wherein FIG. 11(a) shows a plan view, and (b) shows a cross-sectional view taken along line XIb-XIb in (a).

Figure 11:
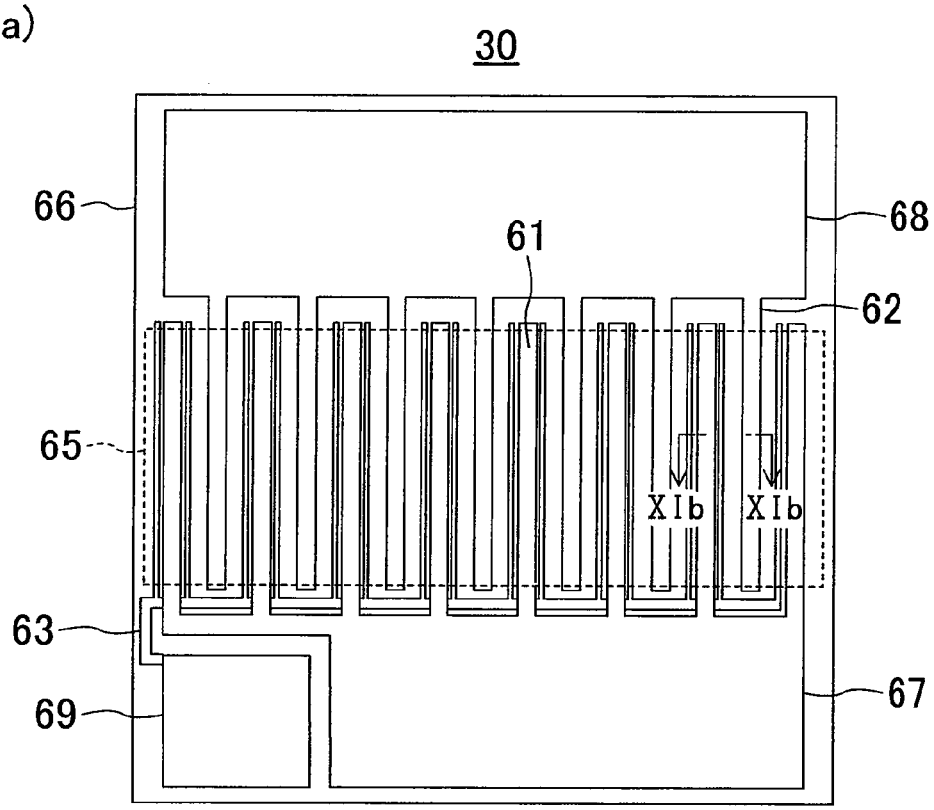
FIGS. 11 (a) and (b) each show a bidirectional switch according to the second embodiment of the present invention, wherein (a) is a plan view, and (b) is a cross-sectional view taken along line XIb-XIb in (a).
Figure 11:
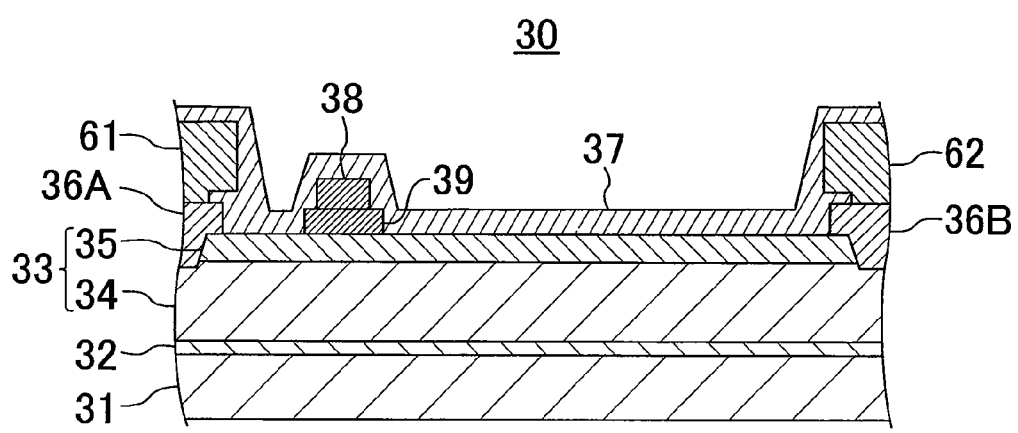

As shown in FIG. 11, the switching element of the second embodiment is a normally-off type heterojunction FET using a nitride semiconductor. A semiconductor element 30, which is a heterojunction FET, includes a substrate 31 of silicon (Si), and a semiconductor layer stack 33 formed thereon via a buffer layer 32 therebetween. The buffer layer 32 is obtained by alternately layering aluminum nitride (AlN) having a thickness of 10 nm and gallium nitride (GaN) having a thickness of 10 nm, and has a thickness of 2 μm. The semiconductor layer stack 33 includes a first semiconductor layer 34, and a second semiconductor layer 35 having a greater bandgap than the first semiconductor layer 34, layered in this order from the substrate side. In the present embodiment, the first semiconductor layer 34 is an undoped gallium nitride (GaN) layer having a thickness of 2 μm, and the second semiconductor layer 35 is an n-type aluminum gallium nitride (AlGaN) layer having a thickness of 20 nm.

Due to spontaneous polarization and piezopolarization, charges are generated near the heterojunction interface between the first semiconductor layer 34 and the second semiconductor layer 35. Thus, there is produced a channel region being a two-dimensional electron gas (2DEG) layer having a sheet carrier concentration of $1 \times 10^{13}$ cm$^{-2}$ or more and a mobility of 1000 cm$^2$V/sec or more.

A first ohmic electrode 36A to be the source and a second ohmic electrode 36B to be the drain are formed on the semiconductor layer stack 33 spaced apart from each other. The first ohmic electrode 36A and the second ohmic electrode 36B are obtained by layering together titanium (Ti) and aluminum (Al), and are in an ohmic contact with the channel region. FIG. 11 shows an example where portions of the second semiconductor layer 35 are removed and the first semiconductor layer 34 is dug down by about 40 nm so that the first ohmic electrode 36A and the second ohmic electrode 36B are in contact with the interface between the second semiconductor layer 35 and the first semiconductor layer 34, in order to reduce the contact resistance. Alternatively, the first ohmic electrode 36A and the second ohmic electrode 36B may be formed on the second semiconductor layer 35.

A first ohmic electrode wire 61 made of gold (Au) and titanium (Ti) is formed on the first ohmic electrode 36A, and is electrically connected to the first ohmic electrode 16A. A second ohmic electrode wire 62 made of gold (Au) and titanium (Ti) is formed on the second ohmic electrode 36B, and is electrically connected to the second ohmic electrode 36B.

A control layer 39, which is a p-type semiconductor layer, is selectively formed on the n-type second semiconductor layer 35 in a region between the first ohmic electrode 36A and the second ohmic electrode 36B. A gate electrode 38 is formed on the control layer 39. The gate electrode 38 is obtained by layering together palladium (Pd) and gold (Au), and is in an ohmic contact with the control layer 39.

A passivation film 37 of silicon nitride (SiN) is formed so as to cover the second semiconductor layer 35 and the control layer 39. With the formation of the passivation film 37, it is possible to compensate for a defect that leads to a so-called "current collapse", thus improving the current collapse.

The first control layer 39 is magnesium (Mg)-doped p-type GaN having a thickness of 300 nm. The second control layer 39 and the second semiconductor layer 35 together form a pn junction therebetween. Therefore, if the voltage between the first ohmic electrode 36A, which is a source electrode, and the gate electrode 38 is 0 V, for example, a depletion layer expands from the control layer 39 of p-type GaN into the channel region, thereby blocking the current flow from the second ohmic electrode 36B to the first ohmic electrode 36A. Thus, there is realized a semiconductor element capable of a so-called "normally-off operation". With a configuration where the thicknesses of the semiconductor layers are as shown in the example above, the threshold voltage is 1.5 V.

As shown in FIG. 11, the semiconductor element 30 of the present embodiment is a multi-finger-type FET, and can be considered to be an arrangement of units, each including the first ohmic electrode 36A, the gate electrode 38 and the second ohmic electrode 36B, alternately reversed from one another with respect to the second ohmic electrode 36B.

The semiconductor element 30 includes an active region 65 where devices are formed, and an inactive region 66 where pad electrodes and wiring structures are formed. The inactive region 66 is a region obtained by selectively increasing the resistance of the semiconductor layer stack 33 by implanting ions (B) such as boron.

A first ohmic electrode pad 67 of gold (Au), a second ohmic electrode pad 68 and a gate electrode pad 69 are formed on the inactive region 66, with an insulating film (not shown) of silicon nitride (SiN) therebetween. The first ohmic electrode wire 61 is electrically connected to the first ohmic electrode pad 67, and the second ohmic electrode wire 62 is electrically connected to the second ohmic electrode pad 68. A first gate electrode wire 63, which is electrically connected to the gate electrode 38, is made of the same material as the gate electrode 18, and is electrically connected to the gate electrode pad 69 via an opening formed in the insulating film. With such a structure, the gate width of the FET can be made very large, and it is possible to implement an FET capable of operating with a large current.

The semiconductor element 30 includes the gate electrode 38 formed on the control layer 39 having the p-type conductivity. Therefore, by applying a forward bias from the gate electrode 38 to a channel region that is produced in an interface region between the first semiconductor layer 34 and the second semiconductor layer 35, holes can be injected into the channel region.

Since hole mobility is much lower than electron mobility in a nitride semiconductor, holes injected into the channel region hardly contribute as a current carrier. Therefore, the injected holes generate the same amount of electrons in the channel region, thereby increasing the effect of generating electrons in the channel region, and thus act like donor ions. In other words, since a carrier concentration can be modulated in the channel region, a normally-off type nitride semiconductor switching element having a large operating current and a low resistance can be realized.

When a gate voltage of 3 V or more, exceeding the built-in potential of the pn junction, is applied to the semiconductor element 30, holes are injected into the gate, thus increasing the current by the above-described mechanism, thereby realizing an operation with a large current and a low ON-resistance.

Figure 12:
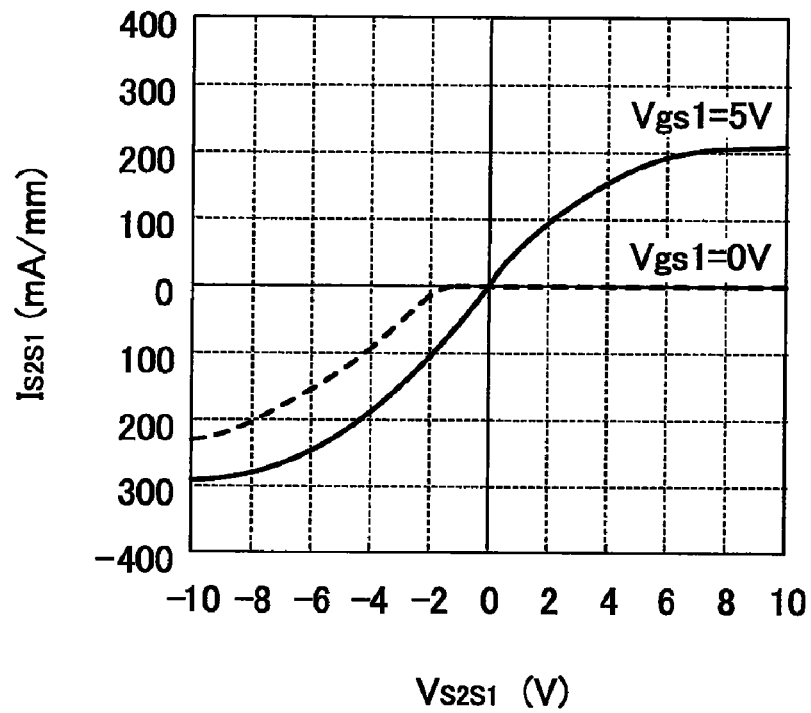
FIG. 12 A graph showing current-voltage characteristics of the bidirectional switch according to the second embodiment of the present invention.

FIG. 12 shows the current-voltage characteristics of the semiconductor element 30. In FIG. 12, the horizontal axis is the voltage (Vs2s1) between the first ohmic electrode 36A and the second ohmic electrode 36B, the vertical axis is the current (Is2s1) per unit gate width (1 mm) between the second ohmic electrode 36B and the first ohmic electrode 36A, and Vgs1 is the voltage between the gate electrode 38 and the first ohmic electrode. Herein, the sign of Vs2s1 is defined so that it is positive when the potential of the second ohmic electrode 36B is higher than the potential of the first ohmic electrode 36A, and is negative when the potential of the first ohmic electrode 36A is higher than the potential of the second ohmic electrode 36B. The sign of Is2s1 is defined so that a current flowing from the second ohmic electrode 36B to the first ohmic electrode 36A is positive, and a current flowing from the first ohmic electrode 36A to the second ohmic electrode 36B is negative.

Where Vgs1 is 0 V, which is less than or equal to the threshold voltage, the semiconductor element 30 can realize a first operation in which the current flowing from the second ohmic electrode 36B to the first ohmic electrode 36A is blocked while the current flowing from the first ohmic electrode 36A to the second ohmic electrode 36B is conducted. This is because in the region where Vs2s1 is positive, a depletion layer expands from the p-type control layer 39, which functions as the gate, into the semiconductor layer stack 33, thereby blocking the current flowing from the second ohmic electrode 36B, which is the drain, to the first ohmic electrode 36A, which is the source.

In the region where Vs2s1 is negative, since the potential of the first ohmic electrode 36A is higher than the potential of the second ohmic electrode 36B, it can be considered to be a transistor in which the first ohmic electrode 36A is the drain and the second ohmic electrode 36B is the source. For example, where Vs2s1 is −3 V, the first ohmic electrode 36A, which is the drain, and the gate electrode 38 are at the same potential, and the voltage with respect to the second ohmic electrode 36B, which is the source, is 3 V. Thus, 3 V, which is greater than or equal to the threshold voltage, is applied between the gate and the source, and it can be considered to be a transistor in which a voltage of 3 V is applied between the drain and the source. Therefore, a current can be conducted from the first ohmic electrode 36A, which is the drain, to the second ohmic electrode 36B, which is the source. When a current flows from the first ohmic electrode 36A to the second ohmic electrode 36B, there is an offset voltage of 1.5 V corresponding to the threshold voltage of the gate.

Where Vgs1 is 5 V, which is greater than or equal to the threshold voltage, it is possible to realize a second operation in which the current is conducted in both directions between the first ohmic electrode 36A and the second ohmic electrode 36B with current-voltage characteristics with no offset voltage. This is because a depletion layer has not expanded from the p-type control layer 39, which functions as the gate, into the semiconductor layer stack 33, whereby the current can be conducted in both directions through the channel region.

The threshold voltage of the semiconductor element 30 varies depending on the carrier concentration of the channel region. Thus, for example, by increasing the thickness of the second semiconductor layer 35, which is an AlGaN layer, or by increasing the Al content thereof, it is possible to increase the carrier concentration of the channel region, and to reduce the threshold voltage to 0.5 V, for example. This decreases the offset voltage occurring due to the threshold voltage. Therefore, where Vgs1 is less than or equal to the threshold voltage, it is possible to reduce the ON-resistance when the current flows from the first ohmic electrode 36A to the second ohmic electrode 36B.

Note that when a voltage of, for example, 0 V, which is less than or equal to the threshold voltage, is applied to the gate, the semiconductor element 30 can remain OFF with a small blocking current of $1 \times 10^{-6}$ A/mm or less even if Vs2s1 is in the positive region and Vs2s1 becomes a voltage as high as 300 V, for example.

As described above, when a voltage less than or equal to the threshold voltage is applied to the gate electrode 38, the semiconductor element 30 performs the same operation as that of a diode assumed by considering the second ohmic electrode 36B as the cathode and the first ohmic electrode 36A as the anode.

Figure 13:
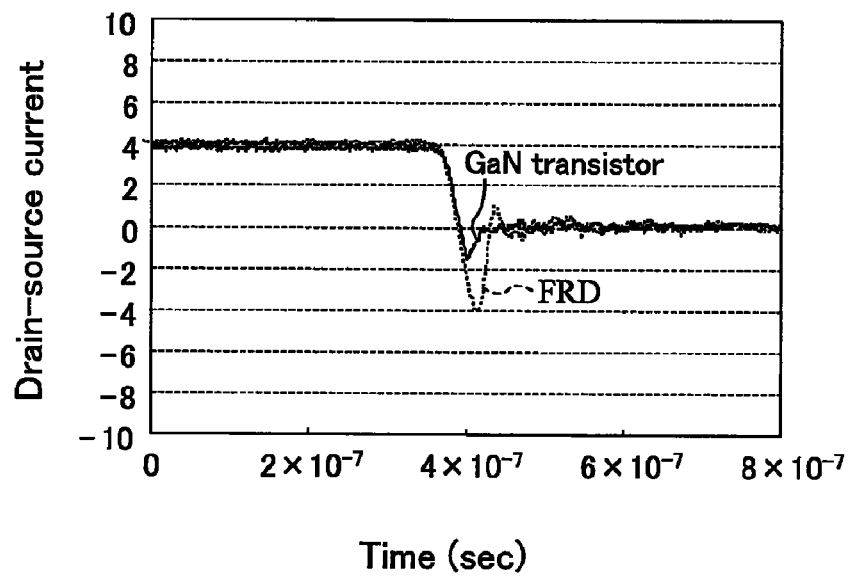
FIG. 13 A graph showing recovery characteristics when the bidirectional switch according to the second embodiment of the present invention is operated as a diode.

FIG. 13 shows the recovery characteristics when the semiconductor element 30 operates as a diode. In FIG. 13, the vertical axis is the current (Ids) between the drain, which is the cathode, and the source, which is the anode, and the horizontal axis is the time. The sign of Ids is the same as that described above. During measurement, a current of 4 A was conducted, after which a high voltage was applied. As shown in FIG. 13, it is clear that the recovery current when the semiconductor element 30 is operated as a diode is smaller than the recovery current of a normal FRD. That is, where the semiconductor element 30 is used as an inverter, an external flywheel diode is not necessary because it operates as a flywheel diode itself. When it operates as a flywheel diode, the recovery current can be made much smaller than that of a conventional FRD. Therefore, as compared with an IGBT with an external conventional FRD, the switching loss can be reduced.

Such an operation as a diode with a very small recovery current is made possible because it is a heterojunction FET using a nitride semiconductor. With a MOSFET using a normal silicon, there always exists a body diode because of the structure thereof. When the MOSFET is used as a switching element, it is not necessary to provide an external flywheel diode, because of the presence of the body diode. However, a body diode is a pn junction diode, and has a much larger recovery current than an FRD. Therefore, there is a large power loss due to the recovery current, and it is not possible to reduce the heat generation.

(4) Operation of Inverter Circuit

A PWM control operation of the 120-degree conduction method performed by the gate controller 9 of FIG. 10 will now be described with reference to the timing diagram shown in FIG. 14.

The upper-arm switching elements 56a to 56c each have a PWM control period of an electrical angle of $2\pi/3$, alternating with one another. The PWM control period is divided into pulse periods, each of which is the inverse of the predetermined carrier frequency, and the upper-arm switching element is turned ON during a predetermined pulse width period set in each pulse period and OFF during each pulse interval period. The PWM control is performed by adjusting the pulse width period.

Moreover, the upper-arm switching element 56a is PWM-controlled during the period t0-t2, the upper-arm switching element 56b is PWM-controlled during the next period t2-t4, and the upper-arm switching element 56c is PWM-controlled during the next period t4-t6. That is, t0-t2 is the PWM control period for the switching element 56a, t2-t4 is the PWM control period for the switching element 56b, and t4-t6 is the PWM control period for the switching element 56c. The lower-arm switching element 56e remains continuously conductive during the period t5-t1, the lower-arm switching element 56f remains continuously conductive during the next period t1-t3, and the lower-arm switching element 56d remains continuously conductive during the next period t3-t5. That is, t5-t1 is the continuous conduction period for the switching element 56e, t1-t3 is the continuous conduction period for the switching element 56f, and t3-t5 is the continuous conduction period for the switching element 56d.

In the PWM control period, each of the lower-arm switching elements 56d to 56f is turned ON during the OFF period, i.e., the pulse interval period, of one of the upper-arm switching elements 56a to 56c of the same phase, and is turned OFF during the pulse width period thereof. That is, in the present embodiment, an upper-arm switching element and a lower-arm switching element of the same phase perform a complementary operation in the PWM control period.

Figure 15:
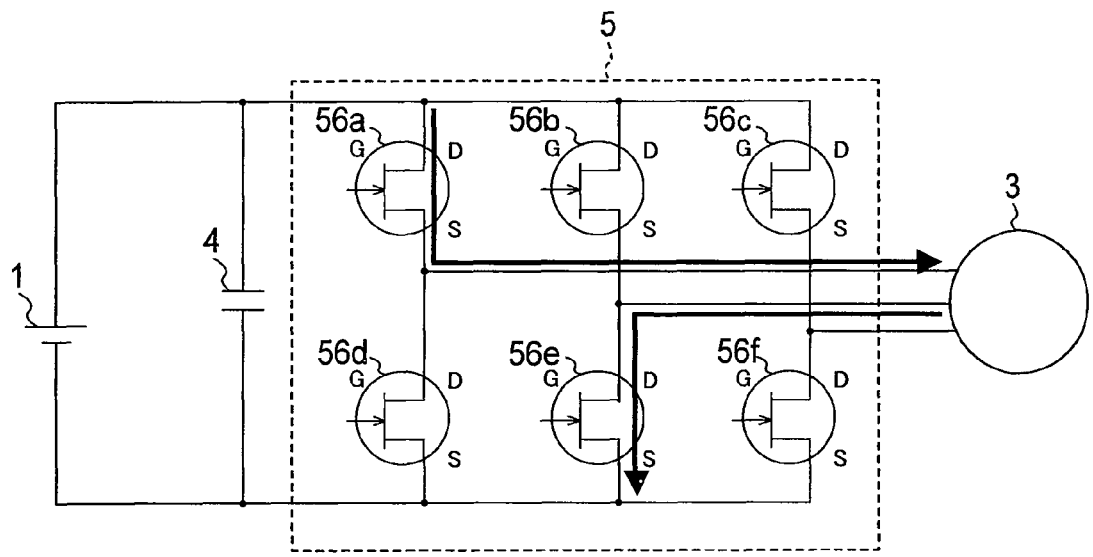
FIGS. 15 (a) and (b) each show a current flow during an operation of the motor driving circuit according to the second embodiment of the present invention, wherein (a) is a diagram showing the operation during the pulse width period for the upper-arm switching elements, and (b) is a diagram showing the operation during the pulse interval period for the upper-arm switching elements.
Figure 15:
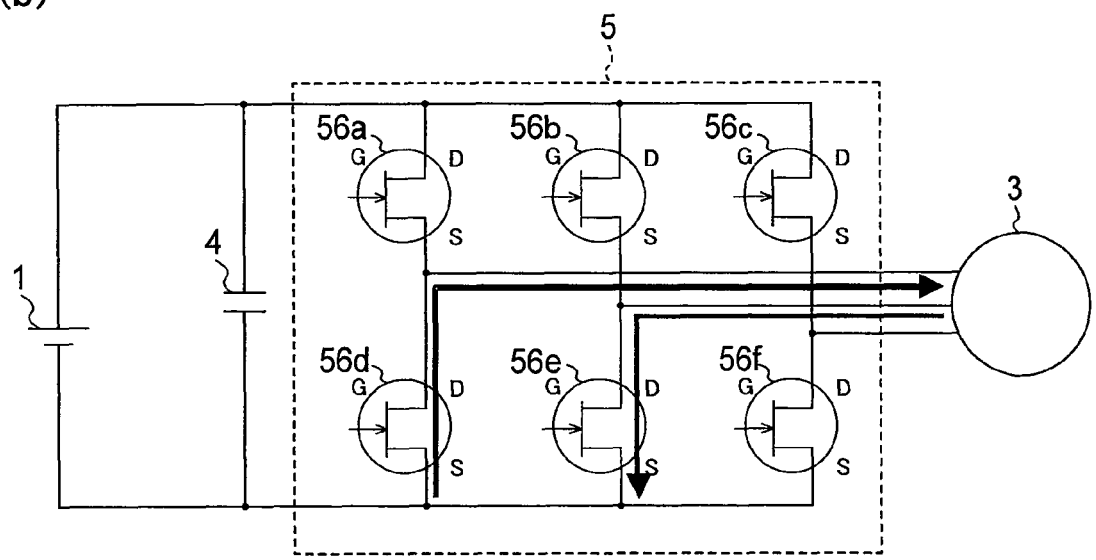

The current flow will now be described with reference to FIGS. 15(*a*) and 15(*b*). FIG. 15(*a*) shows a case where the upper-arm switching element 56*a* is ON during the period t0-t1 of FIG. 10. The current flowing from the switching element 56*a* to the three-phase brushless DC motor 3 recirculates to the DC power source through the switching element 56*e*. At this time, a magnetic energy is accumulated in the stator coil of the three-phase brushless DC motor 3.

FIG. 15(*b*) shows a case where the upper-arm switching element 56*a* is OFF during the period t0-t1 of FIG. 10. Due to the magnetic energy accumulated in the stator coil of the three-phase brushless DC motor 3, a flywheel current recirculates through the switching element 56*d* and the three-phase brushless DC motor 3 and the switching element 56*e*.

The switching element 56*d* is a bidirectional switch, which when being OFF (Vgs=0V) can be considered to be a diode in which the drain serves as the cathode and the source as the anode, as described above. Therefore, when the switching element 56*d* is OFF, the flywheel current flows from the source to the drain. Thus, while a flywheel current is conducted through an external flywheel diode in a conventional inverter, a current can be conducted through the switching element 56*d* in the present invention, whereby it is not necessary to provide an external flywheel diode.

Where a flywheel current is conducted from the source to the drain of the switching element 56*d*, when Vgs becomes 0 V, there is a conduction loss due to the offset voltage (1.5 V). At this time, by turning the switching element 56*d* ON (Vgs=5 V), the switching element 56*d* can conduct a flywheel current with current-voltage characteristics with no offset voltage. Thus, a flywheel current can be conducted with a small ON voltage, and it is possible to reduce the loss of the inverter. Moreover, it is possible to significantly reduce the heat generation occurring in a conventional inverter due to the flywheel diode, and it is possible to simplify the cooling mechanism, to increase the efficiency of the inverter, and to reduce the size thereof. Of course, the ON-resistance when the bidirectional switch is ON is set so that the ON voltage where the switching element is turned ON to conduct a flywheel current is lower than the ON voltage when the bidirectional switch is operating as a diode.

While only the U-phase PWM control period has been described above, the remaining two phases will not be described below as the same holds true also for these phases.

Figure 14:
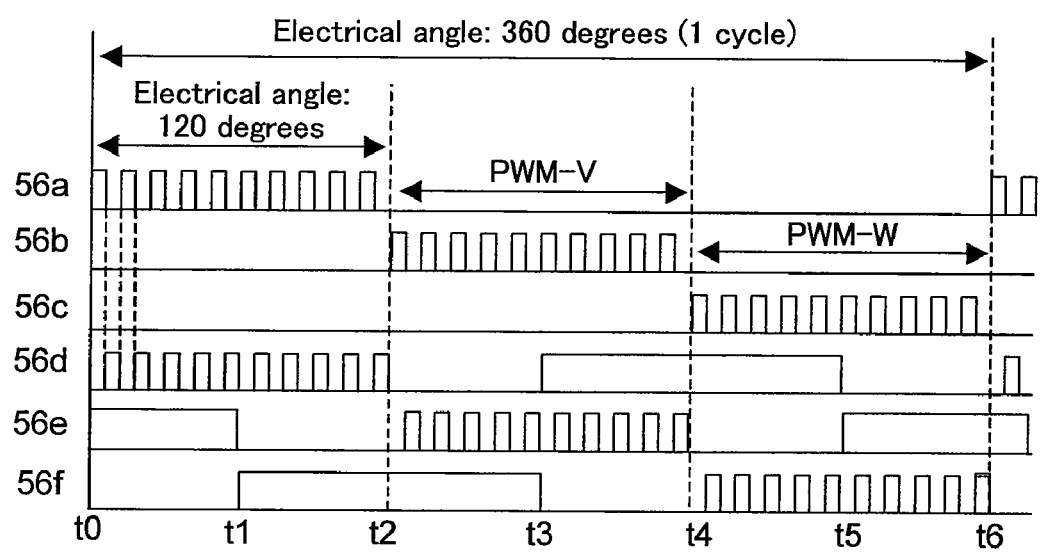
FIG. 14 A timing diagram of an operation of the motor driving circuit according to the second embodiment of the present invention.

Moreover, in FIG. 14, it is preferred that the switching elements 56*a* and 56*d* of the same phase are each turned ON after the other is turned completely or almost OFF in the PWM control period of itself. It is preferred that a dead time is provided in the switching period, during which the switching elements 56*a* and 56*d* are both OFF. With the provision of such a dead time, it is possible to prevent the short-circuit of the power supply and a substantial power loss due to the two switching elements being ON at the same time. Note that also during the dead time, the switching element 56*d*, which is a bidirectional switch, is OFF, where it operates as a diode. Therefore, a flywheel current can be conducted from the source to the drain, and the current flowing into the inductance is not blocked abruptly, whereby it is possible to prevent the switching element 56*d* from breaking down. Note that while the U-phase arm operation has been described above, the same holds true for the switching element operation for the V-phase arm and the W-phase arm. Note that in FIG. 14, PWM-U, PWM-V and PWM-W each denote the PWM control period of the corresponding phase.

Note that while the switching elements 56*d* to 56*f* are performing a complementary operation in synchronism with the switching elements 56*a* to 56*c*, respectively, in FIG. 14, it is not necessary to perform a complementary operation. Specifically, the switching element 56*d* may only perform the diode operation during the PWM-U period, the switching element 56*e* may only perform the diode operation during the PWM-V period, and the switching element 56*f* may only perform the diode operation during the PWM-W period.

While a PWM control of a 120-degree conduction method has been described above in the present embodiment, similar effects can be achieved by performing a similar complementary operation also by a 180-degree conduction method. With a 180-degree conduction method, the motor may be a three-phase induction motor.

Note that a surge absorber element such as a varistor or a Zener diode may be connected in parallel to each switching element of the motor driving circuit shown in FIG. 10. With such a configuration, it is possible to absorb the surge when a high voltage exceeding the breakdown voltage of the switching element is instantaneously applied from outside to the switching element due to lightning, power supply abnormality, etc. In this case, it is preferred that the clamp voltage of the surge absorber element is set to be higher than the breakdown voltage of the switching element to which it is connected.

The upper-arm switching elements 56*a* to 56*c* may each be an IGBT with a MOS transistor or an FRD connected in parallel. Also in such a case, no flywheel diode is needed for the lower-arm switching elements 56*d* to 56*f*, and it is therefore possible to reduce the number of components.

Note that a bootstrap circuit may be used for the power supply for gate bias of the upper-arm switching elements 56*a* to 56*c*.

Also in the second embodiment, the lower-arm switching element may be PWM-controlled as shown in the first variation of the first embodiment.

Note that while a PWM control of a 120-degree conduction method has been described in the embodiments and the variation thereof, similar effects can be achieved by performing a similar complementary operation also by a 180-degree conduction method.

Note that while a bidirectional switch used in the present invention is made into a normally-off device by using a p-type semiconductor, it may be a bidirectional switch of a normally-on type having a Schottky junction gate electrode using Ni, or the like. In such a case, a negative bias circuit is used for the gate circuit, and a negative bias is applied to the gate electrode when the bidirectional switch is OFF. An insulating film of $SiO_2$, AlN, or the like, may be formed between the gate electrode and the semiconductor layer stack to thereby achieve a MIS structure.

INDUSTRIAL APPLICABILITY

The motor driving circuit of the present invention can achieve a reduction in the switching loss due to the recovery current and the conduction loss of the switching element, and is useful as a motor driving circuit for a three-phase motor, etc.

The invention claimed is:
1. A motor driving circuit, comprising:
a three-phase inverter circuit, including three upper-arm switching elements for driving upper arms of different phases of the three-phase motor, and three lower-arm switching elements for driving lower arms of different phases,
at least one of the lower-arm switching elements and the upper-arm switching elements is a semiconductor element, including
a semiconductor layer stack made of nitride semiconductor layers formed on a substrate,
a first ohmic electrode and a second ohmic electrode formed on the semiconductor layer stack spaced apart from each other, and
a first gate electrode formed between the first ohmic electrode and the second ohmic electrode, wherein the semiconductor element performs a diode operation in which a voltage less than or equal to a threshold voltage of the first gate electrode is applied to the first gate electrode with reference to a potential of the first ohmic electrode, thereby conducting a current flow from the first ohmic electrode to the second ohmic electrode and blocking a current flow from the second ohmic electrode to the first ohmic electrode.

2. The motor driving circuit of claim 1, wherein the semiconductor element performs a bidirectional FET operation in which a voltage higher than the threshold voltage of the first gate electrode is applied to the first gate electrode with reference to the potential of the first ohmic electrode, thereby conducting a current flow from the first ohmic electrode to the second ohmic electrode, and conducting a current flow from the second ohmic electrode to the first ohmic electrode.

3. The motor driving circuit of claim 1, wherein the threshold voltage of the first gate electrode of the semiconductor element is 0 V or more.

4. The motor driving circuit of claim 3, comprising:
a first p-type semiconductor layer between the semiconductor layer stack and the first gate electrode.

5. The motor driving circuit of claim 4, wherein the semiconductor element has an operation mode in which a voltage greater than or equal to a built-in potential of a pn junction formed by the first p-type semiconductor layer and the semiconductor layer stack is applied between the first gate electrode and the first ohmic electrode.

6. The motor driving circuit of claim 3, wherein the upper-arm switching elements are given, one after another, different predetermined pulse width modulation control phase periods so that each upper-arm switching element is conductive during each pulse width period in the corresponding pulse width modulation control phase period,
each of the lower-arm switching elements is conductive during each pulse interval period, which is a period excluding the pulse width period in each pulse cycle in the pulse width modulation control phase period of one of the upper-arm switching elements of the corresponding phase, and
the three-phase motor is controlled by a pulse modulation control by modulating the pulse width period.

7. The motor driving circuit of claim 1, wherein the semiconductor element includes a first insulating film between the first gate electrode and the semiconductor layer stack.

8. The motor driving circuit of claim 1, wherein the semiconductor element includes a second gate electrode formed between the first gate electrode and the second ohmic electrode, and a voltage greater than or equal to a threshold voltage of the second gate electrode is applied to the second gate electrode with reference to a potential of the second ohmic electrode.

9. The motor driving circuit of claim 8, wherein the semiconductor device includes
a first insulating film formed between the first gate electrode and the semiconductor layer stack, and
a second insulating film formed between the second gate electrode and the semiconductor layer stack.

10. The motor driving circuit of claim 8, wherein the threshold voltages of the first gate electrode and the second gate electrode of the semiconductor element are 0 V or more.

11. The motor driving circuit of claim 10, comprising
a first p-type semiconductor layer formed between the semiconductor layer stack and the first gate electrode, and a second p-type semiconductor layer formed between the semiconductor layer stack and the second gate electrode.

12. The motor driving circuit of claim 11, wherein the semiconductor element has
an operation mode in which a voltage greater than or equal to a built-in potential of a pn junction formed by the first p-type semiconductor layer and the semiconductor layer stack is applied between the first gate electrode and the first ohmic electrode, and
an operation mode in which a voltage greater than or equal to a built-in potential of a pn junction formed by the second p-type semiconductor layer and the semiconductor layer stack is applied between the second gate electrode and the second ohmic electrode.

13. The motor driving circuit of claim 10, wherein the upper-arm switching elements are given, one after another, different predetermined pulse width modulation control phase periods so that each upper-arm switching element is conductive during each pulse width period in the corresponding pulse width modulation control phase period,
each of the lower-arm switching elements is conductive during each pulse interval period, which is a period excluding the pulse width period in each pulse cycle in the pulse width modulation control phase period of one of the upper-arm switching elements of the corresponding phase, and,
the three-phase motor is controlled by a pulse modulation control by modulating the pulse width period.

14. The motor driving circuit of claim 1, wherein the semiconductor layer stack includes a first semiconductor layer and a second semiconductor layer layered in this order from the substrate side, wherein the second semiconductor layer has a larger bandgap than the first semiconductor layer.

* * * * *